United States Patent [19]
Deacon

[11] Patent Number: 5,297,156
[45] Date of Patent: Mar. 22, 1994

[54] METHOD AND APPARATUS FOR DUAL RESONANT LASER UPCONVERSION

[75] Inventor: David A. G. Deacon, Los Altos, Calif.

[73] Assignee: Deacon Research, Palo Alto, Calif.

[21] Appl. No.: 984,382

[22] Filed: Dec. 2, 1992

Related U.S. Application Data

[63] Continuation-in-part of Ser. No. 826,316, Jan. 24, 1992, Pat. No. 5,206,868, which is a continuation-in-part of Ser. No. 632,447, Dec. 20, 1990, Pat. No. 5,134,622.

[51] Int. Cl.$^5$ .............................................. H01S 3/10
[52] U.S. Cl. ........................................ 372/21; 372/22; 372/31; 372/32; 372/94; 372/93; 359/326; 359/328; 359/329; 359/330
[58] Field of Search ................... 372/21, 22, 31, 32, 372/94, 93; 359/326, 328, 330, 329

[56] References Cited

U.S. PATENT DOCUMENTS

| | | | |
|---|---|---|---|
| 4,884,276 | 11/1989 | Dixon et al. | 372/21 |
| 4,907,238 | 3/1990 | Chun et al. | 372/21 |
| 4,992,750 | 2/1991 | Stewart | 372/21 |
| 5,027,361 | 6/1991 | Kozlovsky et al. | 372/22 |
| 5,068,546 | 11/1991 | Hemmerich et al. | 359/328 |
| 5,134,622 | 6/1992 | Deacon | 372/21 |
| 5,151,909 | 9/1992 | Davenport et al. | 372/22 |
| 5,179,562 | 1/1993 | Marason et al. | 372/22 |

OTHER PUBLICATIONS

A. Ashkin et al. IEEE J. Quant. Elect. QE2 109–124 (1966).
M. Brieger et al. Opt. Commun. 38 423–426 (1981).
H. Hemmati et al., Opt. Lett. 8 73–75 (1983).
J. C. Baumert et al., Appl. Opt. 24 1299–1301 (1985).
W. J. Kozlovsky et al., IEEE J. Quant. Elect. QE24 913–919 (1988).
L. Goldberg et al., Appl. Phys. Lett. 55 218–220 (1989).
W. J. Kozlovsky et al., Appl. Phys. Lett. 56 2291–2292 (1990).
A. Hemmerich et al., Opt. Lett. 15 372–374 (1990).
J. C. Bergquist et al. Opt. Commun. 43 437–442 (1982).
J. M. Yarborough et al. Appl. Phys. Lett. 18 70–73 (1971).
P. D. Drummond et al. Optica Acta 27 321–335 (1980).
H. J. Kimble et al. Quantum Optics IV, J. D. Harvey, D. F. Walls, eds., Springer-Verlag, pp. 58–69 (1986).
S. F. Pereira et al. Phys. Rev. A38 4931–4934 (1988).
C. Zimmermann et al., Opt. Commun. 71 229–234 (1989).

Primary Examiner—Georgia Y. Epps
Attorney, Agent, or Firm—Townsend and Townsend Khourie and Crew

[57] ABSTRACT

A laser frequency conversion device employs a dual resonant optical cavity in which closed optical paths exist for both the pump beam and the generated beam. The optical cavity is designed so that the optical paths overlap the acceptance volume in phase space for coupling power from the pump beam into the output beam. At least one of the beams is pumped by an external laser which is aligned and mode matched to the cavity mode. The frequency of the pump laser or the cavity resonance modes is selected, generally by adjustment, to cause buildup of optical power at the pump frequency. The temperature and the angle of the nonlinear material are selected for phase match in the nonlinear interaction within the material. The frequencies of the modes near the output frequency are independently selected to cause buildup of optical power at the output frequency.

74 Claims, 13 Drawing Sheets

METHOD AND APPARATUS FOR DUAL RESONANT LASER UPCONVERSION

CROSS-REFERENCE TO RELATED APPLICATIONS

This application is a continuation-in-part application of co-pending patent application Ser. No. 07/826,316 filed Jan. 24, 1991, now U.S. Pat. No. 5,206,868 issued Apr. 27, 1993 entitled RESONANT NON-LINEAR LASER BEAM CONVERTER, which is a continuation-in-part application of patent application Ser. No. 07/632,447 filed Dec. 20, 1990, now U.S. Pat. No. 5,134,622 issued Jul. 28, 1992 entitled DIODE-PUMPED OPTICAL PARAMETRIC OSCILLATOR. The content of the parent and grandparent applications are incorporated herein by reference.

BACKGROUND OF THE INVENTION

This invention relates to frequency conversion means for producing coherent radiation at optical frequencies not easily available from present lasers, and more particularly relates to nonlinear optical means for doubling or mixing the output of one or more solid state lasers in an external cavity which is resonant at the wavelengths of the pump lasers and the generated wavelengths, in order to produce high conversion efficiency and high output power stability despite low input power.

It has been known since the early 1960s that certain nonlinear crystals have the property of converting a fraction of the input power at a given optical frequency into an output beam at twice the optical frequency. The same nonlinearity can mix two input beams to produce an output beam of the sum frequency.

A. Ashkin et al. [*IEEE J. Quant. Elect.* QE2 109–124 (1966)] described theoretically how to enhance the efficiency of doubling or mixing by resonating either the fundamental frequency or the generated frequency. They showed how the generated power depends on the optical loss inside the resonator, and pointed out the advantage of noncritical phase matching. In the case of fundamental resonance, they describe how to optimize the input coupling transmission, including the effect of mode conversion loss, as was known at the time for microwave resonators. They successfully demonstrated both doubling and mixing of a two-mode helium-neon laser with harmonic resonance only, and doubling with fundamental resonance only. They decided against using dual resonance (simultaneous resonance for both the fundamental and the harmonic), because of phasing problems on multiple passes through the crystal.

This pioneering work led to the development of singly resonant devices which used the resonant cavity of a laser to enhance the second harmonic generation. There is a large body of literature describing nonlinear conversion inside the cavity of a laser, where the laser frequency is either doubled, mixed with the output from another laser, or even mixed with the residual light from the pump laser which excites the first laser. None of this prior art is directly relevant to the invention. As explained hereinafter the present invention uses an external resonant cavity.

M. Brieger et al. [*Opt. Commun.* 38 423–426 (1981)] were the first to show that improved conversion efficiency can be obtained by resonating the pump laser in a cavity external from the laser resonator. Their work has been followed up by many other papers reporting similar work with singly resonant external cavities, all of which used noncritically phase matched nonlinear crystals. This work includes generation of ultraviolet light from dye and Argon lasers [H. Hemmati et al., *Opt. Lett.* 8 73–75 (1983)], the generation of blue light from dye lasers [J. C. Baumert et al., *Appl. Opt.* 24 1299–1301 (1985)], and the generation of green light from YAG lasers [W. J. Kozlovsky et al., U.S. Pat. No. 5,027,361; W. J. Kozlovsky et al., *IEEE J. Quant. Elect.* QE24 913–919 (1988)].

Diode lasers have been used to generate blue light only in singly resonant noncritically phase matched $KNbO_3$ [L. Goldberg et al., *Appl. Phys. Lett.* 55 218–220 (1989); W. J. Kozlovsky et al., *Appl. Phys. Lett.* 56 2291–2292 (1990); A. Hemmerich et al., U.S. Pat. No. 5,068,546; and A. Hemmerich et al., *Opt. Lett.* 15 372–374 (1990)].

After more than ten years of development, this prior art can be considered to be reasonably mature. It is sufficient for producing a good conversion efficiency (1.7%–39%) in two wavelength ranges where noncritical phase matching can be used (532 and 421–432 nm) with nonlinear crystals having a high nonlinearity ($LiNbO_3$ and $KNbO_3$, respectively).

Nevertheless, the prior art suffers from several difficulties. Power fluctuations in the pump laser are amplified by the nonlinearity, producing instability in the output power at and above the 8% level observed by Kozlovsky et al. in their high efficiency doubled YAG output. In the ultraviolet, no high nonlinearity materials are available. Only high power dye or Argon lasers have been used to produce a UV output, but an input power of 2 W was needed to produce a 4% noncritically phase matched conversion efficiency to 257 nm [J. C. Bergquist et al. *Opt. Commun.* 43 437–442 (1982)]. Lower power lasers such as the desirable solid state lasers (including diode and diode-pumped lasers) are insufficient for producing usable output power in the UV even with noncritical phase matching, since the output power drops as the square of the input power. Most regions of the spectrum are inaccessible with solid state lasers and the current state of the art since they require critical phase matching, which lowers the conversion efficiency even further due to the effects of walkoff.

Ashkin et al. mentioned but rejected the use of dual resonance (harmonic resonance at the same time as the pump laser resonance) for increasing the generated power. This alternative has been rejected many times over the years. A solution to the multiple pass phasing problem was devised in 1971 by J. M. Yarborough et al. [*Appl. Phys. Lett.* 18 70–73 (1971)] and tested in a two-pass configuration. Unfortunately, the phase alignment obtained by this means is only maintained at a specific temperature, pressure, and humidity. The phase alignment wanders off if any of these ambient conditions change. After nine more years, P. D. Drummond et al. [*Optica Acta* 27 321–335 (1980)] analyzed theoretically the small signal dynamics of the dual resonant doubler and predicted an output power instability above a certain pump power threshold.

The first experimental reference to a dual resonant doubler is by H. J. Kimble et al. [*Quantum Optics IV.* J. D. Harvey, D. F. Walls, eds., Springer-Verlag, pp. 58–69, 1986] who doubled an Argon laser with KDP. S. F. Pereira et al. [*Phys. Rev.* A38 4931–4934 (1988)] later built a dual resonant doubler for producing green light from a YAG laser With $MgO:LiNbO_3$. Both of these experiments were performed with noncritically phase matched doubling crystals in linear concave-concave cavities. Neither report describes how to obtain dual resonance in the presence of walkoff (critical phase matching). G. J. Dixon et al. [U.S. Pat. No. 4,884,276] mentioned the possibility of a dual resonant optical mixer in the context of noncritical phase matching, but again did not describe how to deal with cavity stability in the case of critical phase matching.

Finally in 1989 a critically phase matched dual resonant doubler was reported in the literature [C. Zimmermann et al., *Opt. Commun.* 71 229-234 (1989)]. In this work, an argon laser beam at 488 nm was doubled at 0.4% conversion efficiency in barium borate phase matched at an angle of 55 degrees. Heretofore there has been no subsequent work published respecting this approach.

The dual resonant doubler as described in the prior art suffers from several important disadvantages. Zimmermann et al. state that critically phase matched dual resonance requires a linear plano-concave cavity geometry to produce a closed round trip for both ordinary and extraordinary beams. This result rules out the desirable ring resonator, the concave-concave linear approach used in the prior noncritically phase matched work of Kimble, Pereira, et al., and many other cavity configurations.

Zimmermann et al. also describe two ways of obtaining simultaneous resonance at the fundamental and second harmonic frequencies: adjusting the overall length of the cavity using the dispersion of air as described by Yarborough et al., and adjusting the phase matching angle of the nonlinear crystal. These approaches each have unresolved difficulties. Adjusting the cavity length in air to achieve dual resonance has the problem that changes in the environment shift the phase alignment away from optimum. For example, a temperature change of 13° C. in a 20 cm air path is enough to shift phase by about 90 degrees in a 700 nm doubler. Compensating for such changes in real time by length adjusting is difficult because the large motions required (a few mm) can result in serious perturbations of the cavity closed path due to undesired mechanical coupling or off-axis reflection. Also, the required displacement is too large for the most convenient actuators (such as PZTs) needed for automatic phase adjustments. Changing the phase matching angle to compensate the phase drift in air reduces the conversion efficiency (by 36% in the above example).

A doubling approach is needed which permits high enough conversion efficiency for diode and diode-pumped solid state lasers to be used despite their relatively low power. Improvements are needed which stabilize the output power fluctuations and which permit generation at more wavelengths than are now possible. Improvements are also needed which reduce the numerous sensitivities of the prior art to drifts.

My U.S. Pat. No. 5,134,622 filed Dec. 20, 1990 sets forth as one example a dual resonant mixer with two laser pump sources. Claim 18 recites such a configuration. My co-pending parent patent application Ser. No. 07/826,316 filed Jan. 24, 1992, now U.S. Pat. No. 5,206,868, describes a dual resonant mixer configuration which includes doubling a single laser pump beam. Claims 22 and 31 recite such configurations. Neither of my other related patent properties provide details about certain solutions to the problem of walkoff.

What is needed are improvements, in particular in procedures for resonator design, which optimize overlap of the pump beam with the acceptance volume in phase space for generating the output beam, allowing the conversion efficiency to be significantly enhanced.

SUMMARY OF THE INVENTION

According to the invention, a laser frequency conversion device employs a dual resonant optical cavity in which closed optical paths exist for both the pump beam and the generated beam. The optical cavity is designed so that the optical paths overlap the acceptance volume in phase space for coupling power from the pump beam into the output beam. At least one of the beams is pumped by an external laser which is aligned and mode matched to the cavity mode. The frequency of the pump laser or the cavity resonance modes is selected, generally by adjustment, to cause buildup of optical power at the pump frequency. The temperature and the angle of the nonlinear material are selected for phase match in the nonlinear interaction within the material. The frequencies of the modes near the output frequency are independently selected to cause buildup of optical power at the output frequency.

In one embodiment of an apparatus according to the invention, the pump beam is provided by a diode laser which is injection locked to a ring cavity. In a second embodiment, the pump laser is isolated from optical feedback from a cavity which is a linear cavity, and is frequency locked to a longitudinal mode of the cavity. In alternative embodiments of the invention, the pump laser is either a diode pumped solid state laser or a grating stabilized diode laser pumping either a linear cavity or a ring cavity. In an alternative embodiment, the system is an optical parametric oscillator. In a further alternative embodiment, the device has a bidirectional cavity with optical feedback stabilization of the source laser. In further alternative embodiments of the invention, two pump lasers pump either a ring or a linear cavity in a mixer configuration. Two further aspects of the invention are significant enough to stand independent of the other embodiments: first, the use of the temperature dependence of the index of refraction of air in combination with its dispersion to adjust and control the resonant frequencies of a cavity independently at two different frequencies, and second, the use of independent feedback loops to control the relative frequency and the relative phase of the optical feedback to an injection locked laser.

This invention eliminates several problems in the prior art, most notably making it possible to efficiently double a diode laser or a diode pumped solid state laser in a critically phase matched dual buildup cavity configuration. Critical phase matching allows use of many more nonlinear crystals so that a much greater range of output wavelengths can be produced. For example, a 690 nm diode laser can be doubled with approximately 10% efficiency in a critically phase matched $LiIO_3$ crystal. A diode laser emitting near either 860 nm or 980 nm can be quadrupled with approximately 2% efficiency by feeding the output of a $KNbO_3$ doubler into a dual resonant BBO doubler to provide an overall quadrupling of the initial frequency.

Zimmermann et al. did not recognize that one could use solid state lasers to drive dual resonant nonlinear converters, possibly because of their notorious very low continuous-wave (CW) power levels. This invention makes possible a substantially higher conversion efficiency than the Zimmermann et al. approach and thereby enables the use of lower power pump lasers including the solid state lasers.

The invention also exhibits wider tunability and better power stability than is known in the art. The tunability is no longer limited by the temperature tuning range of the nonlinear crystal, but is increased by angle tuning to cover the entire frequency range available to the gain curve of the pump laser. By using grating stabilized diode lasers as pumps, more than 20 nm of tuning range can be achieved. The power stability is improved by saturating the conversion process so that the power conversion in the nonlinear crystal approaches or exceeds the losses in the cavity at the pump frequency, greatly reducing the sensitivity of the system to pump power fluctuations.

It is a goal of this invention to make possible the practical use of optical feedback from a dual resonant cavity. The prior art contains only linear cavities which feed back primarily the rejected light at frequencies away from the resonance. If optical feedback is used with linear resonators, the laser will frequency lock away from the desired frequency of the optical mode of the cavity.

It is a further goal of this invention to make possible the use of a dual resonant cavity in multielement bidirectional cavity configurations. Such configurations are also useful with optical feedback when injecting on an oblique mirror, as is made possible in this invention, since the undesirable rejected light does not return into the laser.

It is a further goal of this invention to make possible the use of a dual resonant cavity in ring configuration which emits all of the generated power along a single axis.

It is a further goal of this invention to make possible the simultaneous resonance of a cavity at two related frequencies independent of the first frequency.

It is a further goal of this invention to extend the stability of optical injection locked lasers by implementing feedback loops on both the relative frequency of the laser and the relative phase of the injected optical beam.

It is a further goal of this invention to optimize the efficiency of critically phase matched optical parametric oscillators which include resonance for both orthogonal polarizations in the cavity.

The invention will better understood by reference to the following detailed description taken in conjunction with the following drawings.

BRIEF DESCRIPTION OF THE DRAWINGS

FIGS. 10(a)–(d) show the progressive alignment of the laser emission frequency and the generated frequency.

DESCRIPTION OF SPECIFIC EMBODIMENTS

Figure 1:
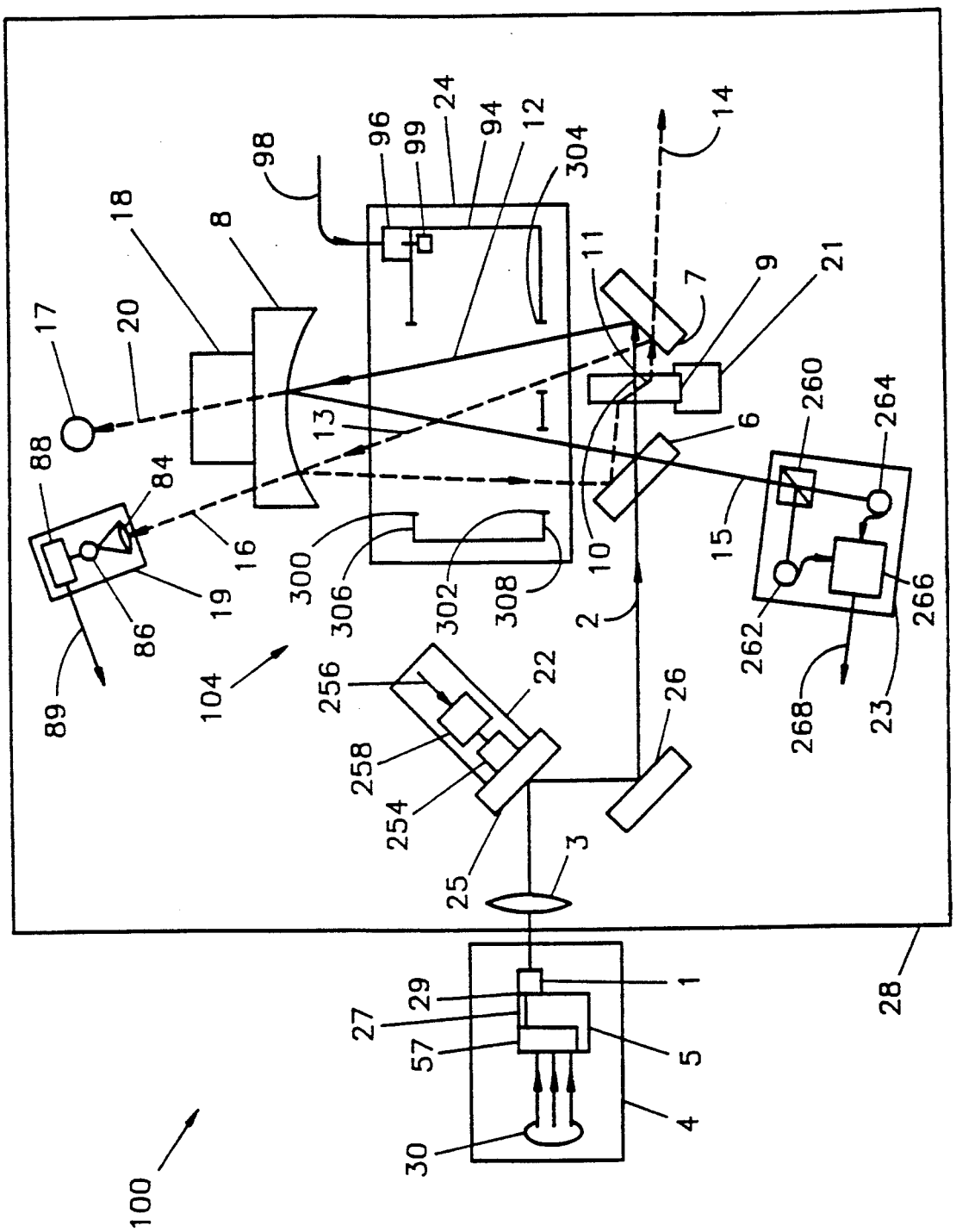
FIG. 1 is a schematic diagram of an embodiment of the invention which illustrates a dual resonant ring cavity nonlinear converter with optical feedback to the pump laser.

FIG. 1 shows a dual resonant ring doubler 100 which is divided into an optical pump means 4 and a frequency conversion means 28. The optical pump means comprises at least one solid state laser pump, preferably a diode laser 1, mounted on heat sink assembly 5. The heat sink assembly 5 includes means for disposing of the heat collected from the diode laser 1, such means optimally being thermoelectric (TE) coolers, but optionally being air cooling fins, and/or water heat exchangers. It also includes temperature sensing means 27, connection means 29 to deliver excitation current to the laser diode, multiple control inputs 30 for controlling both the diode excitation current and the TE cooler current, and electronics 57 for generating control signals in response to error signals for at least the diode current and the diode temperature.

Figure 13:
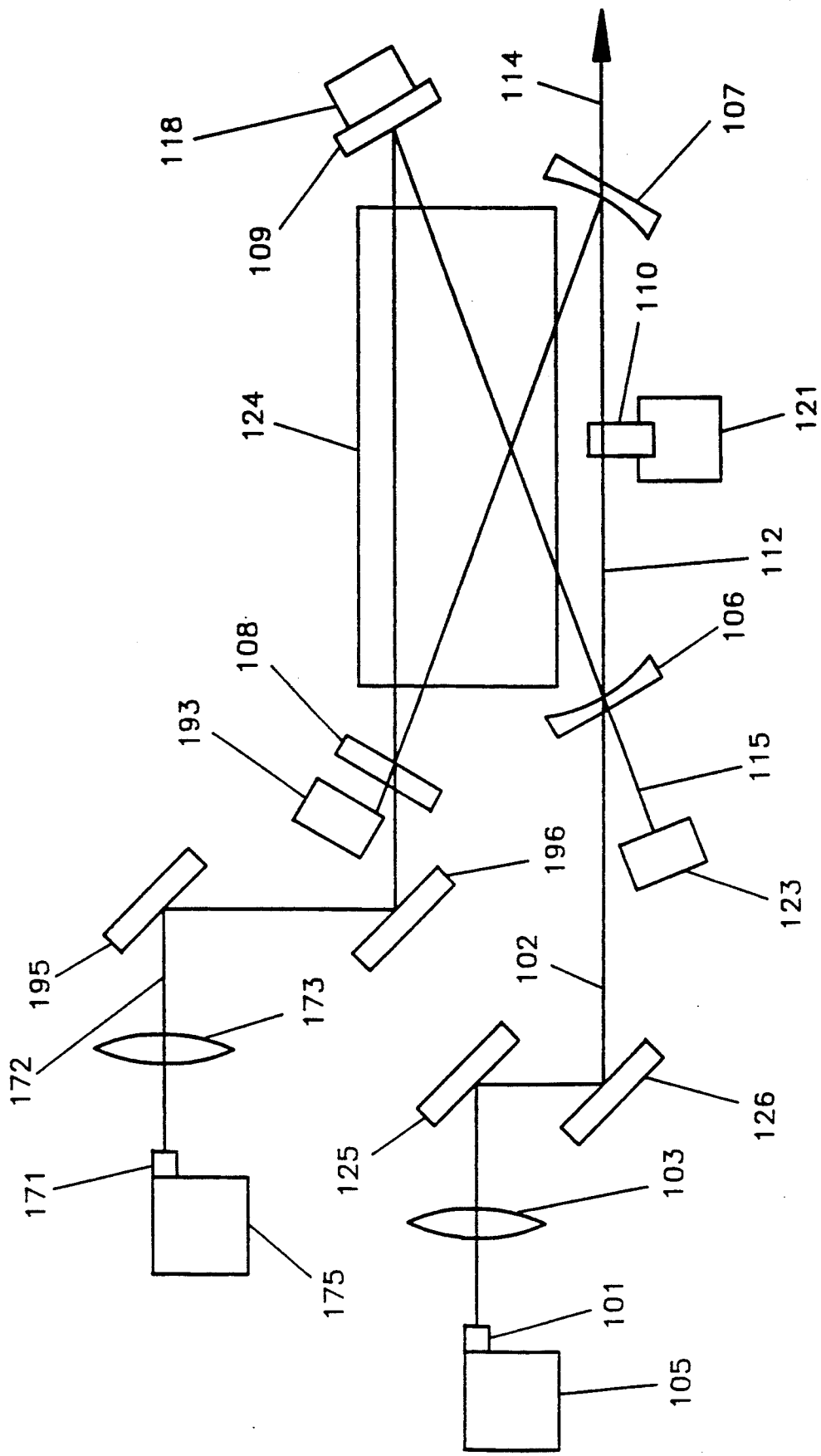
FIG. 13 is a schematic diagram of an alternative embodiment of the invention in which two coherent sources with related frequencies are used to pump a resonator which is adjusted for simultaneous resonance at the two frequencies.

The diode laser output beam 2 is brought from the optical pump means 4 into the input coupler 6 by means of an optical transport and matching line consisting of the lens system 3 and the alignment mirrors 25 and 26. The lens system 3 contains cylindrical and spherical beam focussing elements separated by predetermined optical path lengths which are set to collimate, astigmatically compensate and mode match the beam into a resonator, such as a ring resonator or bow-tie resonator (which has four reflecting surfaces in a folded path configuration as illustrated in FIG. 13).

In FIG. 1, a ring resonator cavity 104 is formed by two plane mirrors 6 and 7 and one concave mirror 8. The radius of curvature of mirror 8 is in a specific example 7 cm, and the round trip path length is in the example identical, namely, also 7 cm. The radius of curvature R of mirror 8 and the cavity round trip path length L have been chosen so that the cavity is stable, i.e. so that $(1-L/2R)<1$.

A nonlinear crystal 9 is provided in a specific orientation for use as a doubler. The nonlinear crystal 9 is preferably a 1 mm thick slab of $LiIO_3$ cut near a 54.4 degree angle to allow for phase match near normal incidence for doubling an input beam of 687 nm into an output beam of 343.5 nm. The crystal is coated with an antireflection (AR) coating on each face for both 687 and 343.5 nm, and it is placed at the waist of a beam 12, for example, between the plane mirrors 6 and 7 in a closed optical path. Since $LiIO_3$ is a negative uniaxial crystal, the polarization of the input beam is selected so that its electric vector is along the ordinary axis of the oriented nonlinear crystal 9 (Type I phase matching). The angle and temperature of the crystal 9 are adjusted with the crystal control means 21 in order to achieve phase matching for the nonlinear conversion process.

Figure 19:
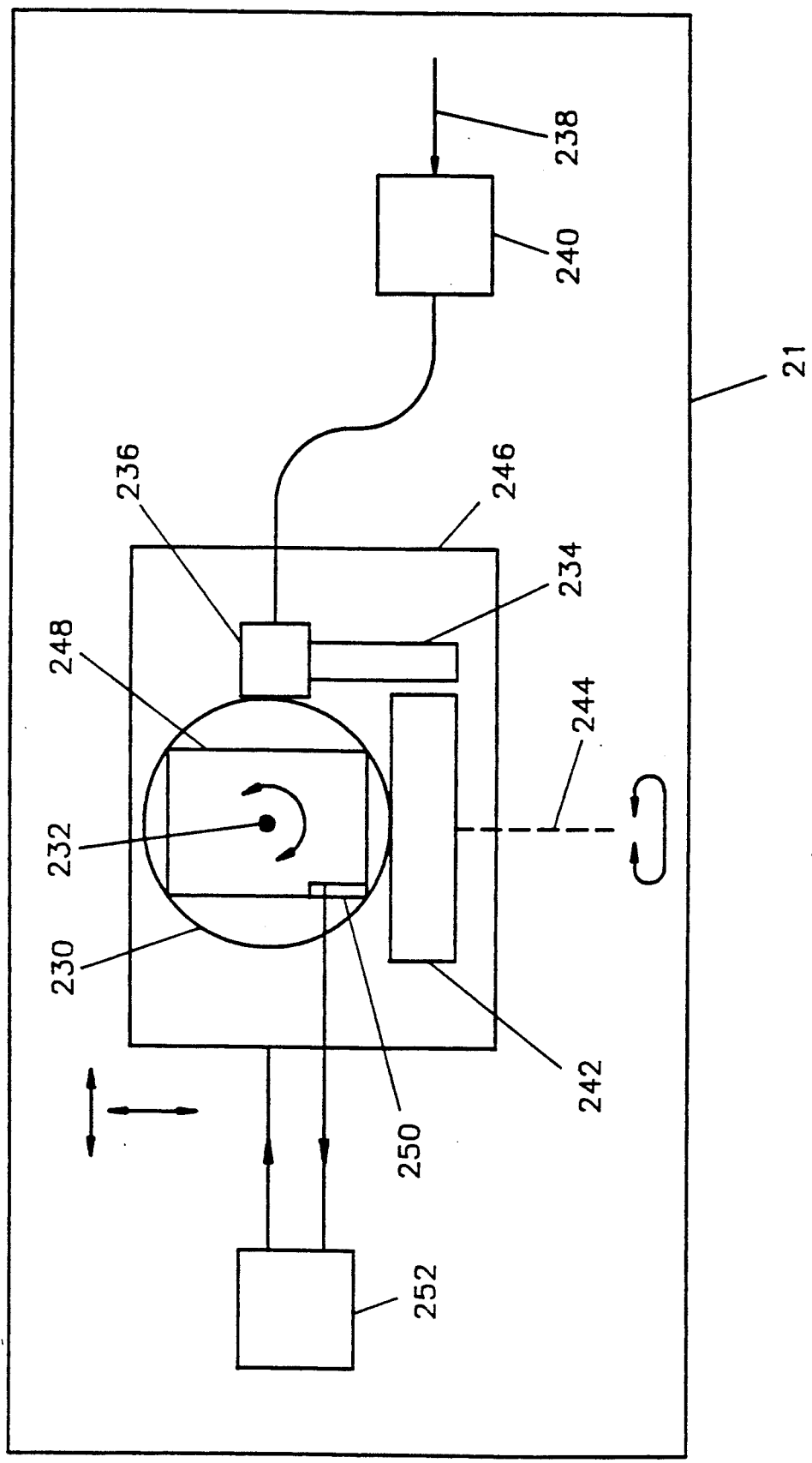
FIG. 19 is a schematic diagram of a crystal control means.

The crystal controlling means 21 shown in further detail in FIG. 19 includes several elements: means 230 to adjust the tilt of the crystal 9 about an axis 232 parallel to the ordinary polarization vector, manual 234 and piezoelectric transducer (PZT) actuated 236 control of this angle, a control input 238 to adjust this angle, electronics 240 for generating the control signal from an error signal, means 242 for rotating the crystal about an independent axis 244, means 246 for translating the crystal for optimum alignment, TE cooling means 248, temperature sensing means 250, and control means 252 for adjusting the temperature of the crystal.

The cavity 104 mirrors 6, 7, 8 are aligned to form a closed optical path for beam 12 for the input beam 2 so that a low order Gaussian-type beam builds up in the cavity. The alignment mirrors 25 and 26 are used to align the axis of the input beam 2 to overlap with an axis of the path of beam 12.

Figure 11:
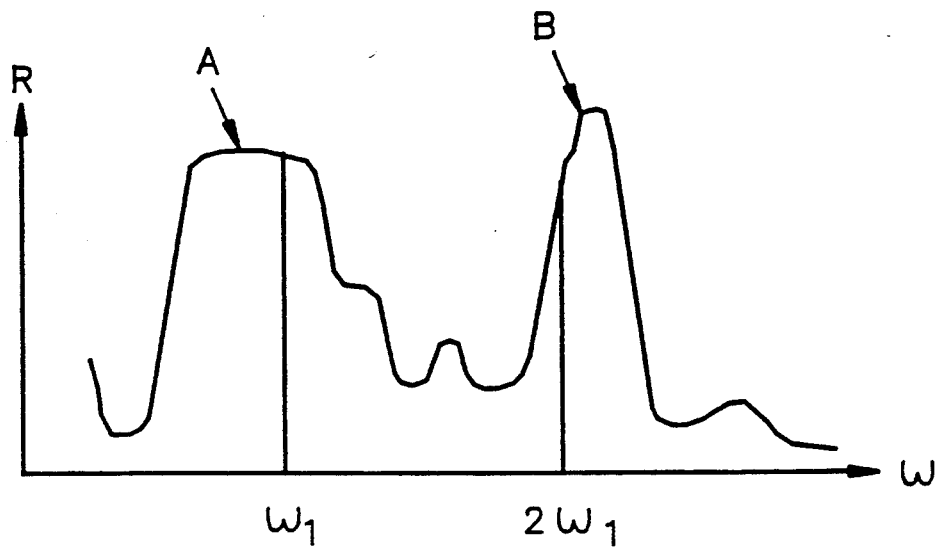
FIG. 11 is a diagram of a mirror reflection curve as a function of frequency which is useful for dual resonant doubling wherein the reflectivity of the cavity mirrors (not including the transmission of the input coupler and the output coupler) is shown to be high for both the first frequency and two times that frequency.

The cavity 104 mirrors 6, 7, 8 are coated for high reflection at the wavelength of the input beam 2 and at the wavelength of an output beam 14. FIG. 11 shows the mirror reflectivity as a function of optical frequency. Two regions A and B of high reflectivity exist, covering the region around the input frequency $\omega_1$ and the region around the output frequency $2\omega_1$. In FIG. 1, the input coupler mirror 6 and the output coupler mirror 7 have enhanced transmissivity at the input and the output wavelengths, respectively, with minimum added transmissivity at other wavelengths. The input coupler mirror 6 has a transmission approximately equal to the sum of the operating losses of the cavity 104 minus the input coupler transmission, in order to minimize the power in a reflected and transmitted beam 15 through input mirror 6 and transverse of the input beam 2. Some residual transmission is also useful at the wavelength of the input pump beam 2 through the other mirrors 7 or 8 for monitoring purposes, but it should be much less than the reflection loss of the respective mirror for optimum performance.

Figure 10A:
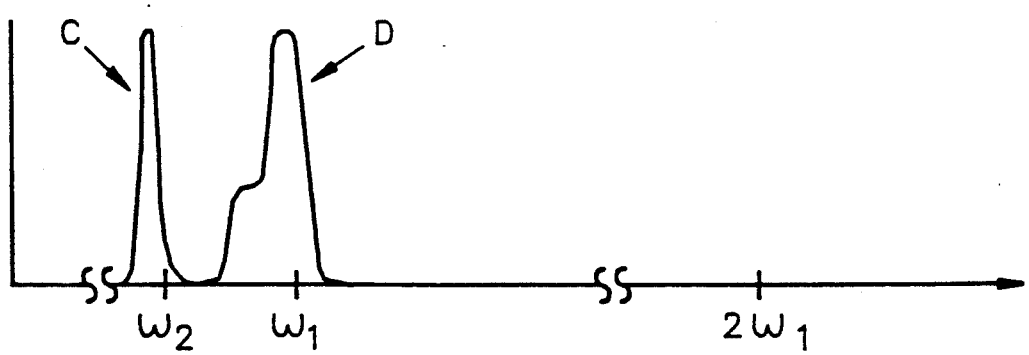
FIG. 10(a) is a diagram which shows the laser emission frequency and the generated frequency.

The spectrum of the diode laser 1 is shown schematically in FIG. 10(a). Two peaks C and D are shown with different linewidths corresponding to the input frequency $\omega_1$ and another frequency $\omega_2$. However, the diode spectrum should more preferably have only a single peak, and the linewidth should preferably be smaller than the linewidth of the longitudinal mode of the cavity 90. (It is useful to have two peaks in the optical pump means in the case of optical mixing where the output frequency is the sum of the input frequencies.)

Figure 10B:
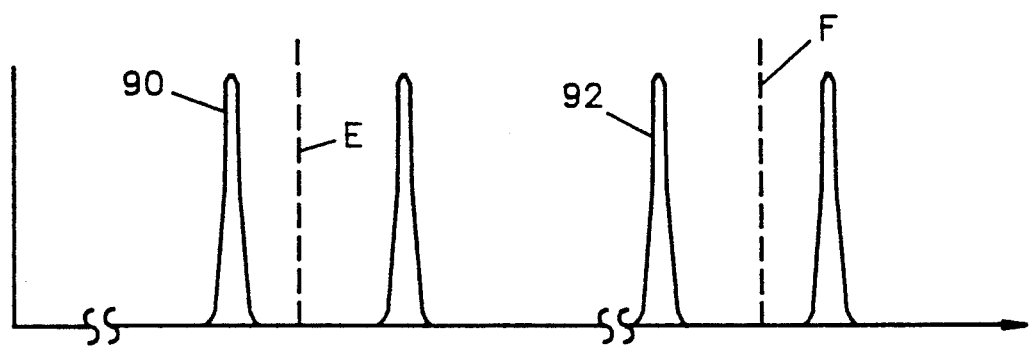
FIG. 10(b) is a diagram which shows the longitudinal modes of the resonator aligned with FIG. 10(a).
Figure 10C:
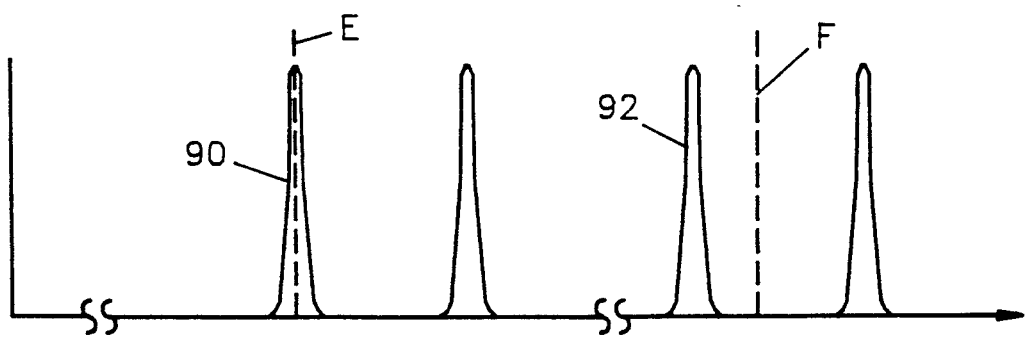
FIG. 10(c) is a diagram which shows the longitudinal modes of the resonator where a first adjustment is made to the relative wavelengths to bring the pump laser on resonance.

Initially, the center E of the diode laser emission frequency $\omega_1$ will usually not overlap the cavity mode 90, as for example shown in FIG. 10(b). The center E of the diode laser wavelength is adjustably selected relative to the cavity mode 90 so that they do overlap, as shown in FIG. 10(c), and power will build up in the cavity 104 (FIG. 1) at the diode laser wavelength.

Alignment of the laser frequency with the cavity mode is preferably achieved with the aid of optical feedback. The emission wavelength of laser 1 is injection locked to the cavity mode. (Injection locking has an additional advantage in that it reduces the bandwidth of the laser.) Referring again to FIG. 1, a small portion of the forward propagating power in the ring resonator cavity 104 is coupled into the reverse direction by scatter from the optical elements, principally the nonlinear crystal. The optical pump means 4 is injection locked by a fraction of the power which is built up in the reverse direction in the ring cavity and transmitted back through the mirror 6 in the reverse direction along the optical path of input beam 2 toward mirror 26. This fraction is kept small (below about 1 part in 1000) to avoid instability in diode lasers of the types known in the art, and to avoid mode splitting in the ring resonator 104.

A beam length adjusting system 22 includes a PZT 254, a control input 256 and drive electronics 258 to control the PZT 254 in response to an error signal at the control input. The length adjusting system 22 adjusts the phase of the optical radiation which is injected into the diode laser 1.

A Hänsch-Couillaud error signal is derived in a helicity detector system 23, which includes a polarizing beamsplitter 260, first and second detectors 262 and 264 and an electronic controller 266 for generating an error signal on output line 268. As is well known in the art, this error signal is proportional to the deviation of the pump frequency from the center of the resonator mode. By controlling the feedback phase with this error signal, the diode laser frequency is locked to the center of the cavity mode, thus employing optical feedback.

Two important quantities must be controlled to optimize the operation of the optical feedback system: the relative phase of optical feedback and the relative wavelength of the laser 1. By the relative phase of the optical feedback, what is meant is the phase difference at a point just inside the laser 1 between the optical feedback beam 2' (which is injected back into the laser source) and the fraction of the laser beam 2 which is retro-reflected from the end mirror of the laser 1 when all optical feedback is removed. By the relative wavelength of the laser 1, what is meant is the difference between the free-running wavelength of the laser 1 and the wavelength of the longitudinal mode of the buildup cavity 104. (The free-running wavelength of the laser 1 is the wavelength it would operate at if all optical feedback is removed.) Optimally, the relative phase of optical feedback is controlled independently of the relative wavelength of the laser 1. (In known prior art, only the relative phase has been controlled.)

Figure 14A:
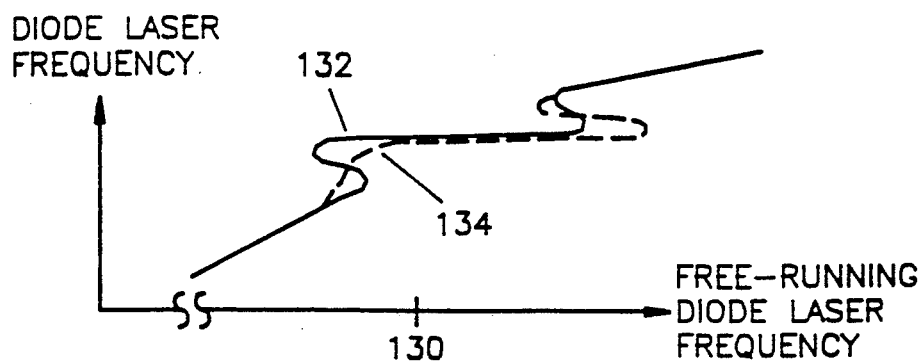
FIG. 14(a) is a diagram of the injection locked diode laser frequency as a function of the free running diode laser frequency in the presence of a feedback resonance for two different feedback phases.

The optical frequency of the input beam 2, under injection locking conditions, is shown in FIG. 14(a). Solid line 132 shows the emitted frequency of the injection locked laser as a function of the independent variable: the free running diode laser frequency relative to the cavity mode frequency, for the optimum relative phase. The dashed line 134 shows the emitted frequency when the relative phase is shifted by $\pi/4$ radians. Clearly, when the relative phase shifts, the injection locked emission frequency also shifts, all other parameters being constant. The relative phase of the optical feedback is adjusted so that the emission frequency lies at the center of the cavity mode at the frequency 130. A feedback loop to control this adjustment is preferred, to eliminate the fluctuations in relative phase caused by variations in the feedback optical path length.

The range of adjustment of the relative phase within which the feedback loop remains stable, called the locking range, is quite limited. If the relative wavelength drifts, the relative phase will be driven outside the locking range, and the emitted frequency will lose lock. To avoid this situation, a second feedback loop is preferably implemented on the relative wavelength.

Figure 20:
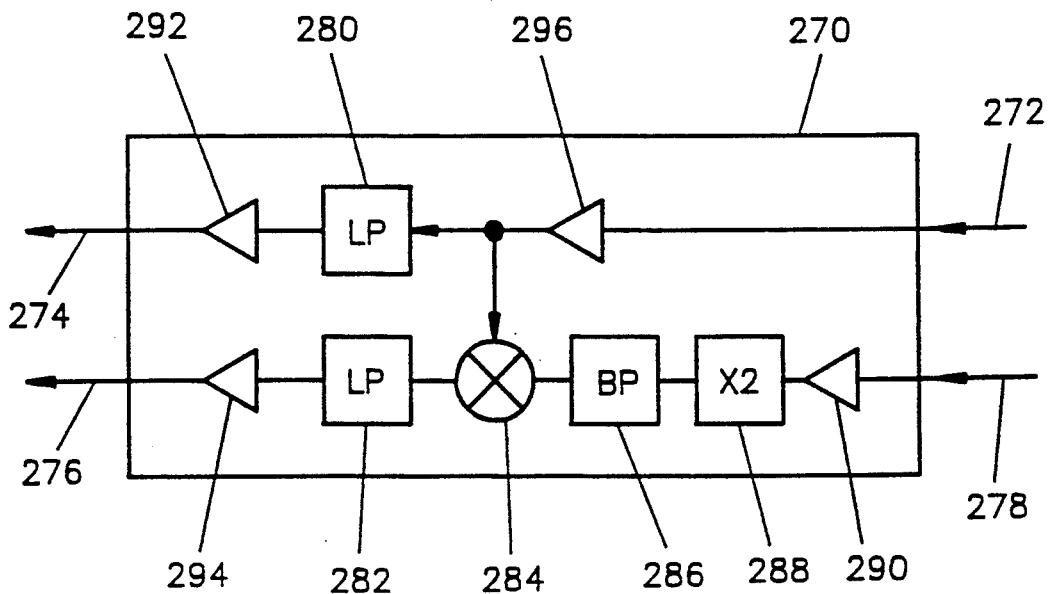
FIG. 20 is a schematic diagram of a control electronics.

Control over both the relative phase and the relative wavelength are achieved based on the Hänsch-Couillaud basic error signal on line 268 of FIG. 1 using control electronics 270 illustrated in FIG. 20. The input line 272 is driven by the basic error signal on line 268. A portion of the input signal passes through amplifier 296, low pass filter 280, and amplifier 292 to produce a low frequency control signal on line 274. The control input 256 of the length adjusting system 22 is connected to the low frequency control line 274, closing the feedback loop so that on the average the laser wavelength is locked near to the center of the cavity mode. The phase response of the low pass filter 280 is adjusted for system stability. This locking process leaves a small feedback error difference between the controlled quantity (the central laser wavelength) and the target quantity (the center wavelength of the cavity mode). The gain and phase spectra of the control electronics can be adjusted to minimize this error.

The error signal for the second feedback loop is derived by modulating either the cavity length with length adjusting system 18, or the laser free running frequency with one of the control inputs 30. The preference is to modulate the laser because its response time is much shorter than that of the PZT in length adjusting system 18, which has structure similar to length adjusting system 22. The laser frequency is weakly modulated at a frequency outside the bandwidth of the low frequency signal on line 274 so that the feedback to the length adjusting system 22 is unaffected. The amplitude of the frequency modulation is a fraction of the width of the cavity mode.

A reference signal at the frequency of the laser modulation is connected to input 278 in FIG. 20. The reference signal passes through amplifier 290, doubler 288, and band pass filter 286. It is then mixed with a portion of the amplified signal from input 272 in mixer 284. The mixer output passes through low pass filter 282 and amplifier 294 before emerging on the output line 276. The resultant error signal is connected to one of the control lines 30 to additively modify the diode laser excitation current proportional to the control voltage. This closes the second feedback loop so that the laser free running emission frequency is locked to the cavity mode frequency 130. Again, the phase characteristic of the low pass filter 282 is adjusted for system stability.

Figure 14B:
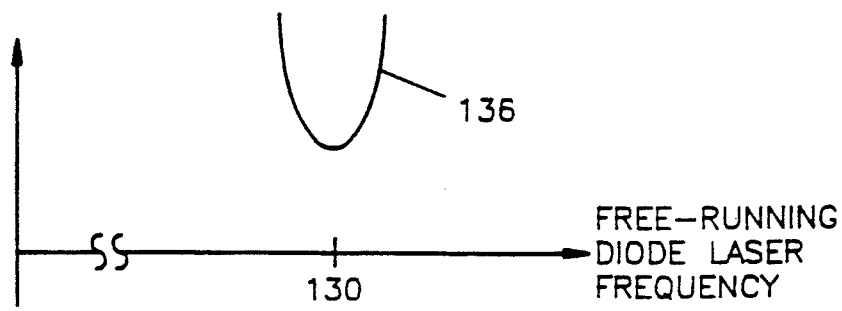
FIG. 14(b) is a diagram of the amplitude of the frequency difference error signal derived at the frequency of a relative wavelength dither over the same frequency range and for the same two phases.
Figure 14C:
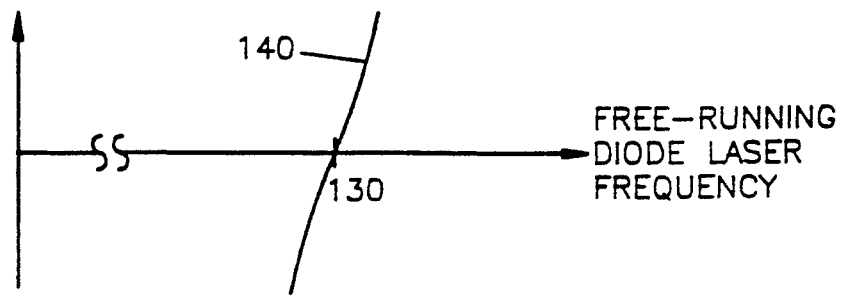
FIG. 14(c) is a diagram of the amplitude of the error signal at the second harmonic of the dither frequency.

The amplitude of the component of the Hänsch-Couillaud error signal at the modulation frequency of the laser is shown by the curve 136 in FIG. 14(b) for the case where the bandwidth of the signal on line 276 is lower than that on line 274. In this case, the optical phase feedback loop reacts first to errors, locking the laser emission frequency to the center of the cavity mode. The error signal shown includes the response of the first feedback loop. FIG. 14(c) shows the amplitude of the component of the Hänsch-Couillaud error signal at twice the modulation frequency of the laser. This signal has a zero crossing near the mode center and is used by the control electronics 270 for the second feedback loop error signal which controls the free running laser frequency.

The two combined feedback loops allow the system to track errors or drifts in both the relative wavelength and the relative phase of the optical feedback, producing maximum stability for the system. As in all cases of multiple loops driven from one signal, the gain spectra of the electronics which process the two error signals must be adjusted for system stability so that signals intended for one feedback loop do not couple too strongly into the other feedback loop, and so stable operation is maintained.

In the general case, the phase matching angle will not be equal to 90 degrees, in which case the generated second harmonic wave in the nonlinear crystal element 9 (FIG. 1) will propagate along an axis 11 different from that of the pump wave (beam 12) by the so-called walk-off angle, a characteristic angle based on material and optical conditions. For buildup to occur, the cavity 104 must be designed so that a closed round trip path exists for the beam 13 at the second harmonic. This path must also overlap path 10 of the fundamental in the crystal to allow coupling.

There are both angular and position matching requirements on the beam 12, which is collectively described as an overlap in phase space. The input beam 10 does not actually occupy the same phase space coordinates in the angular dimension as the output beam, since they are optimally separated by the walkoff angle. However, the phase space of the input beam should overlap a volume in phase space which can be described as the acceptance volume for the nonlinear process. The acceptance volume in phase space is the volume formed by the set of beam coordinates and angles for which the nonlinear conversion is near its maximum. The size of the acceptance volume may be defined by the volume within which the net nonlinear power conversion is reduced from optimum by a certain fraction, which depends upon the application, but may vary from as little as 5 or 10% to as much as about 90%. The most widely quoted acceptance numbers are based on 50% power reduction. The coordinates in the phase space include the transverse positions and angles of the input beam, and may be generalized to include the locations of the two foci in the longitudinal direction (the locations may be different in the two transverse planes for astigmatic beams), and the respective beam waist sizes.

Although the known prior art requires that a plano-concave resonator be employed, general solutions herein disclosed are applicable to any closed cavity. When a birefringent material is placed inside the resonator cavity there are two principal axes along which a beam may be polarized without rotation during propagation. The two planes formed by the wavevector and each of these principal axes are called the ordinary plane and the extraordinary plane for uniaxial crystals. In the following description, a uniaxial symmetry is assumed for simplicity. However, the discussions are also valid for biaxial crystals if the ordinary plane is interpreted as the plane formed by one of the principal axes (which can be the high index axis) and the wavevector, and the extraordinary plane is interpreted as that formed by the other principal axis and the wavevector. The index of refraction in both planes depends, in the general case, on the orientation angles of the crystal, and walkoff in general occurs in both planes.

For the typical Type I phase matching with a negative uniaxial crystal and positive dispersion, the two low-frequency beams are polarized in the ordinary plane, with the generated beam lying in the extraordinary plane. Type II phase matching is said to exist where one of the low frequency beams is "ordinary" polarized and both the generated beam and the other low-frequency beam are "extraordinary" polarized. If the phase matching angle is not exactly 90 degrees (critical phase matching), the extraordinary beam will propagate in the crystal at a different angle from the ordinary beam in a phenomenon known as walkoff. Due to this walkoff, the two beams emerge displaced from each other.

To achieve dual resonance in the presence of a birefringent crystal, the first challenge is to design a resonator for which closed paths exist for the two beams. Each closed path is described by an optical propagation axis which closes on itself after one round trip in the resonator. The axes of the closed paths must be made to cross each other in the nonlinear crystal to produce a good nonlinear coupling between the two optical beams.

The propagation of a ray in an aligned optical system may be described by the well-known ABCD matrix formalism. The ray at any point is described by its position x and angle x' which can be assembled into the vector V. (For biaxial crystals, there is walkoff along two directions, and a four-vector formalism including y and y' must be used; the generalization is straightforward based on the approach given below.) A propagation matrix is developed for each beam segment and optical element in the resonator, and the product of all the matrices yields the round-trip matrix M. The new vector V(n) after the nth round trip is given by the previous vector V(n−1) multiplied by the matrix M.

$$V_o = \begin{pmatrix} x \\ x' \end{pmatrix}_o$$

$$M = \begin{pmatrix} A & B \\ C & D \end{pmatrix}$$

$$V(n) = MV(n-1) = M^n V_o \quad (1)$$

To analyze the ray stability, the matrix M is diagonalized and the eigenvalues $\lambda(a)$ and $\lambda(b)$, and the eigenvectors V(a) and V(b) are found.

$$MV(a,b) = \lambda(a,b) V(a,b)$$

$$\lambda(a,b) = e^{\pm i\theta} \quad (2)$$

It is well known that for stability, the magnitude of the eigenvalues must be less than or equal to unity, $|\lambda| \leq 1$. In a non-dissipative system, the eigenvalues can be described in terms of a simple exponential $\lambda(a,b) = e^{(+, -i\theta)}$ where $\theta$ is a pure phase.

In a real Gaussian optical system, the mirrors are aligned to produce a closed orbit, and focussing is adjusted to achieve transverse beam stability. The resulting optical path will support the ordinary beam of a dual resonant cavity according to the invention. Under conditions of stability, a ray with an arbitrary displacement and angle from the closed orbit will oscillate about the closed orbit as determined by the repetitive application of the propagation matrix M. When the nonlinear crystal is placed into the cavity, the ordinary beam can be realigned for a closed path, but the extraordinary beam undergoes an additional displacement by walkoff each time it traverses the crystal. The problem of stability for the extraordinary beam is to create a situation where the successive displacements do not drive the beam out of the resonator, and where a closed beam path is created for the extraordinary beam.

The solution to this problem is obtained by finding an oscillatory path whose oscillation exactly cancels the walkoff effects on each round trip. Mathematically, we solve for the vector W of initial conditions just before the crystal which returns to itself after one round trip through the cavity including the effects of walkoff. We describe the perturbation introduced in the nonlinear material by the vector P, which is composed of the displacement produced by the walkoff and ideally no angular component. (An angle may be introduced by a wedge in the crystal, which has a different effect on the ordinary and extraordinary beams due to the dispersion.)

In a ring cavity as in FIG. 1, the initial conditions W (a vector) are incremented by the vector P after passing through the crystal, propagated around the cavity, and set equal to W.

$$W = M(W+P) \quad (3)$$

The two vectors W and P can be expressed in terms of a linear combination of eigenvectors with the appropriate amplitudes.

$$P = p_1 V(a) + p_2 V(b)$$
$$W = w_1 V(a) + w_2 V(b) \quad (4)$$

The solution vector W is then derived from equations (2) and (3) as $$W = \frac{p_1 \lambda(a)}{1 - \lambda(a)} V(a) + \frac{p_2 \lambda(b)}{1 - \lambda(b)} V(b) \quad (5)$$

Any ring resonator for which the solution (5) exists will support closed orbits in both the ordinary plane and the extraordinary plane. The extraordinary closed orbit is described by the solution (5) just before the crystal and everywhere else through application of the appropriate ABCD propagation matrices. Both stable and unstable cavities have closed orbits for the extraordinary ray, but the stable configuration is used in order to obtain the lowest loss in the buildup cavity.

Figure 2:
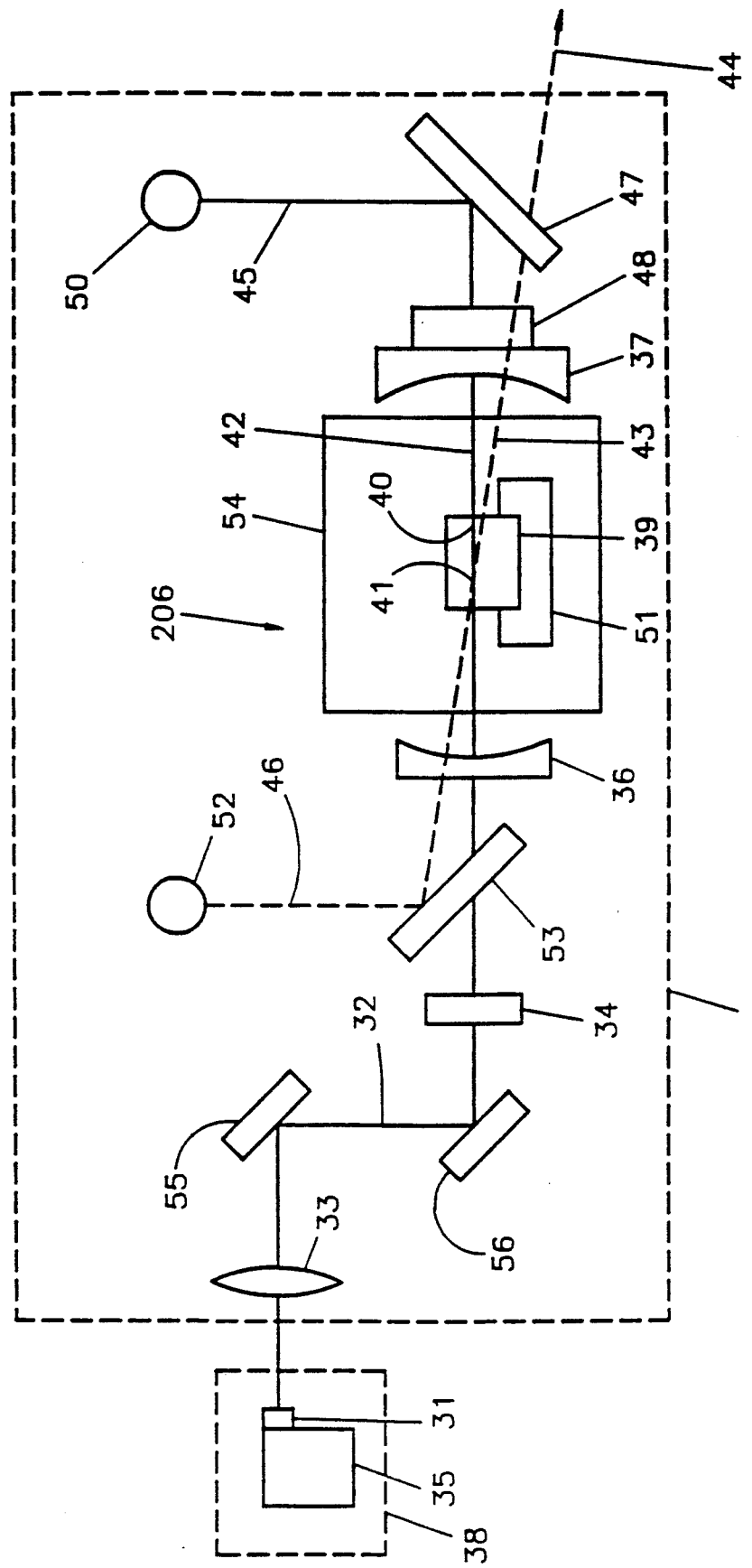
FIG. 2 is a schematic diagram of another embodiment of the invention which illustrates a dual resonant linear cavity nonlinear converter with no optical feedback.

In a linear cavity as in FIG. 2, the beam passes through the nonlinear material 39 twice in a round trip. The vector P must be separated into the effect due to the walkoff alone P(w), and the effect due to the wedge angle alone P(a) because the two effects enter with different signs on the return pass. For simplicity, the wedge effect is ignored in the following. On a round trip in the linear resonator, the initial conditions vector W is first incremented by the vector P(w), then multiplied by the propagation matrix M(r) for the right hand side of the cavity, then decremented by the vector P(w), and finally multiplied by the propagation matrix M(l) for the left- hand side of the cavity. The result must be equal to the starting conditions W.

$$W = M(l)[M(r)(W + P(w)) - P(w)] \quad (6)$$

To obtain the solution, we note that the round trip propagation matrix is equal to the product of M(l)*M(r), we expand the modified vector P in terms of the cavity eigenvectors, $$M(l)M(r) = M$$
$$[M - M(l)]P(w) = p_3 V(a) + p_4 V(b) \quad (7)$$

and expand W as before, to obtain $$W = \frac{p_3}{1 - \lambda(a)} V(a) + \frac{p_4}{1 - \lambda(b)} V(b) \quad (8)$$

As above, both stable and unstable cavities have solutions.

In addition to the ring resonators described by equation (5), this invention makes possible the use of concave-concave linear resonators and general multielement linear resonators described by equation (8).

The remaining issue is how to set the crossing angle and position to lie within the phase space acceptance of the nonlinear process. Optimally, the two modes 12 and 13 (FIG. 1) should overlap physically in the crystal 9 for about one Rayleigh range, which puts a limitation on the crossing angle related to the beam size at the crystal. The physical displacement of the beams should be small enough so that the beam size at the actual crossing point is close to the minimum.

In the angular dimension, the optimization must take into account the walkoff angle. As described above, the crossing angle of the two beams depends on both the walkoff angle of the crystal and the design of the resonator, and it typically exceeds the walkoff angle. The nonlinear polarization which radiates at the walkoff angle couples power into the generated mode with an efficiency which decreases as the crossing angle deviates from the walkoff angle. The detailed dependence of the nonlinear conversion on beam displacement and angle in this non-collinear case can be calculated from the overlap integral of the fields as is well known in the art. In addition, the focussing characteristics in the two transverse planes are taken into account. (Due to the astigmatism which is introduced by tilted transmissive elements and off-axis reflections from curved mirrors, the beam behaves differently in the two transverse planes.) In general, the constraints on the cavity design flow from the spatial, angular, and focussing acceptances determined by the overlap integral. These constraints can always be satisfied by increasing the radius of curvature of the focussing elements or reducing the cavity length, until the crossing angles and displacements are reduced to the desired value.

With the aid of the ring resonator solution described in equation (5), the parameters of the ring resonator (such as the mirror separations and the focussing strength) are adjusted to produce the desired optimal overlap. The triangular ring resonator shown in FIG. 1 has a curved mirror with a radius of 7 cm because equation (5) predicts a tilting of the extraordinary mode of 1.2 mrad due to the walkoff. The (half-power) acceptance angle of the $LiIO_3$ crystal is 1.8 mrad at our 687 nm pump wavelength, so a 7 cm mirror radius accomplishes our objective of staying within the acceptance volume in phase space. If we had chosen a 5 cm radius mirror, the mode tilt would have been 3 mrad, which is substantially outside the acceptance volume.

Since the resonator is symmetric, the displacement of the two beams in the center of the short leg is very close to zero. To compensate for the imperfect symmetry of the cavity, either the cavity asymmetry is adjusted to bring the displacement of the two beams within acceptable limits, or the crystal is translated longitudinally to overlap the two modes optimally in the crystal.

For a specific case of the linear resonator solution, we take the symmetric concave-concave cavity shown in FIG. 2. In this case, the mirror radii are set to 5 cm with a separation of 3 cm, producing a beam crossing angle of 1.2 mrad, according to equation (8). The displacement of the extraordinary beam from the ordinary beam at the center of the nonlinear crystal is almost exactly zero (except for aberrations, etc.). The displacement of the two beams is again reduced to zero by adjusting the distance between the nonlinear crystal and one of the resonator mirrors.

There is a useful rule which describes the location in the linear resonator where the two beams can cross with zero displacement in the crystal. The location is the midpoint between the centers of curvature of the two mirrors. In the symmetric cavity, this location is the center of the cavity, but the rule also applies if the mirrors have different radii of curvature. A multielement folded cavity can always be reduced (as is well known in the art) to an effective two-element cavity, where again the centers of curvature rule applies. If one of the mirrors is flat, which is the case of the Zimmermann et al. prior art, the rule implies that the displacement is constant and never zero.

Figure 15:
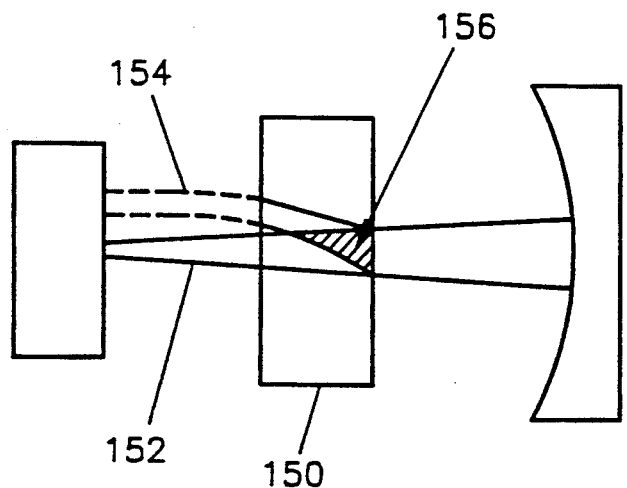
FIG. 15 is a schematic diagram of the prior art showing the overlap region (cross-hatched) between the ordinary and extraordinary beams in the crystal.
Figure 16:
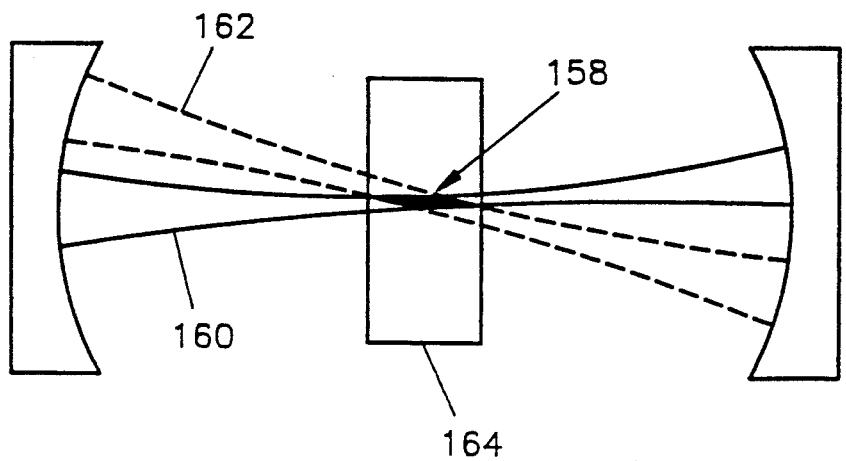
FIG. 16 is a schematic diagram illustrating the improved overlap region (cross-hatched) between the ordinary and extraordinary beams in the crystal according to the invention.

The advantage of this invention over the prior art can be seen by comparing FIGS. 15 and 16. FIG. 15 describes the prior art in which a plano-concave resonator is used and the extraordinary beam 154 (dashed lines) walks off from the ordinary beam 152 (solid lines) inside the crystal 150. The overlap region 156 (shaded) is where the nonlinear conversion process takes place. The overlap region is not at the waist of the beams, and it is one-sided. In contrast, the concave-concave resonator design sketched in FIG. 16 has an overlap region 158 between the ordinary beam 160 and the extraordinary beam 162 which is at the waist of the two beams and therefore provides improved conversion efficiency. In addition, the overlap region 158 is two-sided since the two beams completely cross each other in the crystal 164, thus doubling the conversion efficiency. The disadvantage of the invention is that the crossing angle of FIG. 16 is larger than that of the prior art represented by FIG. 15. The increased crossing angle can be reduced to lie within the phase space acceptance of the nonlinear interaction with the aid of adjustments according to expression (8).

Figure 10D:
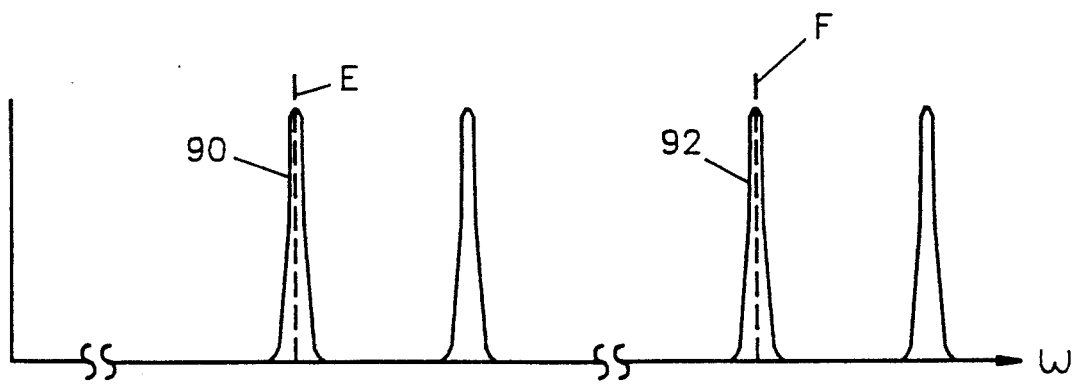
FIG. 10(d) is a diagram which shows the longitudinal modes of the resonator where a second adjustment is made to bring the generated frequency on resonance while maintaining the pump resonance. Together

An adjustment of the mode frequencies at the second harmonic is also required for optical power to build up. Most cavities will have a different round trip optical phase advance at the second harmonic than at the fundamental because of the dispersion of air, the different optical path lengths of the two beams 12 and 13, and because of mirror reflection phase shifts at the two wavelengths. As a result, the second harmonic frequency $2\omega_1$ will not overlap with any one of the cavity modes as shown in FIG. 10(b) and 10(c). The adjustments described above for producing buildup of the fundamental beam guarantee that the round trip phase advance at the fundamental remains approximately constant. A means is thereafter required to adjust the second harmonic phase advance independently of the fundamental phase advance so that a mode 92 overlaps the frequency $2\omega_1$ at F, as shown in FIG. 10(d), without disturbing the alignment at the fundamental frequency $\omega_1$ at E.

Referring to FIG. 1, to control the phase difference between the second harmonic and the fundamental while maintaining perfect phase matching, means for heating 24 including a heating element, such as an oven 94, is used according to the invention to heat the medium (typically air) through which the beam 13 passes. The means for heating 24 also includes an electronic temperature controller 96 with control input 98 and temperature sensor 99. The relative change in phase $\delta\psi$ $$\delta\psi = d\phi_2 = 2d\phi_1 \tag{9}$$

$$d\phi_i = \frac{2\pi n_i}{\lambda_i} 1$$

is given by $$\delta\psi = \delta\psi(o)\left(1 + \frac{dl}{T}\right) + \frac{4\pi l}{\lambda_1}(n_2 - n_1)\left(\frac{dP}{P} - \frac{dT}{T}\right) \tag{10}$$

where $d\phi$ is the optical phase advance experienced by a wave of wavelength $\lambda$ in a medium with index of refraction n over a distance 1. The phase advances $d\phi_2$ and $d\phi_1$ refer to the second harmonic and the fundamental, respectively, and $\delta\psi$ is the phase of the second harmonic generation process. d1 is the change in the optical path length, and P, T, dP, and dT are respectively the pressure and temperature of the air, and the changes in those quantities.

As can be seen from equation (10), the optical path length can be adjusted to set $\delta\psi$ equal to its optimum value, zero, for a given set of parameters. However, drifts in the atmospheric temperature and pressure, for example, will tend to shift $\delta\psi$ away from zero. According to the invention, the temperature of a portion of the air in the optical path is automatically adjusted such as with a feedback loop to lock $\delta\psi$ near zero. By implementing this technique, the difficulty of the Yarborough-type one-time change in the cavity length is also eliminated. By maintaining the oven at an elevated temperature (for example 60° C.), its response time is made relatively fast.

In FIG. 1, a temperature regulation system 24 is shown to enclose a major portion of the optical paths 12 and 13. To minimize optical losses, the oven 94 has no windows, with the optical beams 12, 13 entering and exiting through holes 300, 302, 304, in the sides 306, 308. The oven 94 may optionally enclose a single leg of the optical path in the resonator, or it may optionally enclose the entire resonator 104. It is best to optimize the path length covered by the oven 94 while minimizing the thermal mass of the elements enclosed. The temperature of the oven 94 is adjusted to set the harmonic wavelength on resonance with a cavity longitudinal mode while at the same time adjusting the relative wavelength of the pump laser 1 to maintain simultaneous resonance. The oven 94 is preferably controlled electronically with controller 96 as described above, to maximize the generated second harmonic power.

Referring to FIG. 1, a detector system 19 measures the power in the second harmonic beam 16. Detector system 19 consists of optical collection means 84, detector 86, and control electronics 88 for generating an error signal 89. To realize the feedback loop, the oven temperature is modulated by superimposing a signal on input line 98 at a frequency within the thermal response time of the means for heating 24. The second harmonic power is detected in detector 86 and an error signal proportional to the amplitude of the second harmonic power at the modulation frequency is generated at the output 89 by the control electronics 88. The amplitude of the error signal on the line 89 is proportional to the deviation of the mean oven temperature from its optimal value which sets $\delta\psi=0$. The error signal is connected to the input 98 of the temperature controller 96 so that the error signal drives the temperature back to its optimal value. The temperature modulation frequency is chosen to lie outside the bandwidth of the error signal on output line 89.

Use of an oven has the added advantage in that it reduces fogging in hygroscopic crystals which are maintained inside the oven. Since the feedback loop which controls the fundamental frequency eliminates fast system fluctuations, a slow feedback loop is in most cases sufficient to maintain the second harmonic resonance in the presence of atmospheric changes and other drifts.

The temperature adjustment approach can be used to obtain simultaneous resonance in any dual buildup cavity application, such as doubling, mixing, optical parametric oscillation, and cases such as spectroscopy where a high intensity is needed for intracavity utilization.

The transmissivity of the outcoupling mirror 7 is selected for optimized output power and stability. For high stability and high intracavity second harmonic power, the transmission should be low, but if the transmission is too low, very little light emerges from the cavity. The optimum transmission to create high power in the output beam 14 is approximately equal to the sum of the other losses in the resonator as measured at the wavelength of the harmonic. Depending on the exact optimization, the optimum transmission may deviate from this value by up to about a factor of ten. It is also possible to use the second harmonic beam intracavity, in which case the transmission is optimized near zero, but the application must have low optical loss at both the pump and the second harmonic wavelengths. For intracavity beam use to be advantageous, the additional loss of the application at the two wavelengths must be at or below the order of magnitude of the empty cavity loss, excluding transmission.

The conversion efficiency $\eta$ for the dual resonant cavity, with both waves on resonance, is given by $$\eta = \frac{P_2 \text{(out)}}{P_{pump}} = 4 \left( \frac{T_s}{L_s} \right) \left( \frac{T_f}{L_f} \right) \frac{x \left( 1 + \frac{L_s}{L_f} \right)}{\left[ 1 + x \left( 1 + \frac{L_s}{L_f} \right) \right]^2} \quad (11)$$

where $\eta$ is defined as the ratio between the outcoupled power at the second harmonic $P_2$(out) to the pump power $P_{pump}$ at the fundamental, $T_S$, $L_S$, $T_f$, and $L_f$ are the transmission and loss of the second harmonic and the fundamental, respectively, and x is the ratio of the fundamental power in the buildup cavity divided by the critical power for instability. For stability, x is kept less than 1. The value of x is given by the solution of a cubic equation:

$$x \left( 1 + \frac{L_s}{L_f} \right) = \sqrt[3]{C} \left( \sqrt[3]{d+1} - \sqrt[3]{d-1} \right)^2 \quad (12)$$

$$C = \frac{P_{pump}}{P_o} \cdot \frac{4T_f}{L_f^3 L_s}$$

$$d = \sqrt{1 + \frac{1}{27C}}$$

where $P_O$ is the pump power required to obtain unity single-pass conversion efficiency in the no-depletion approximation. We see that for low pump power (c<1) the efficiency varies linearly with $P_{pump}$ so that the output power varies as the square. However, for high pump power, where $x(1+L_s/L_f)$ is near unity, the efficiency is a constant so that the output power varies only linearly with the input power. (This derivation is based on a theory developed by Drummond et al., op. cit.)

Figure 3:
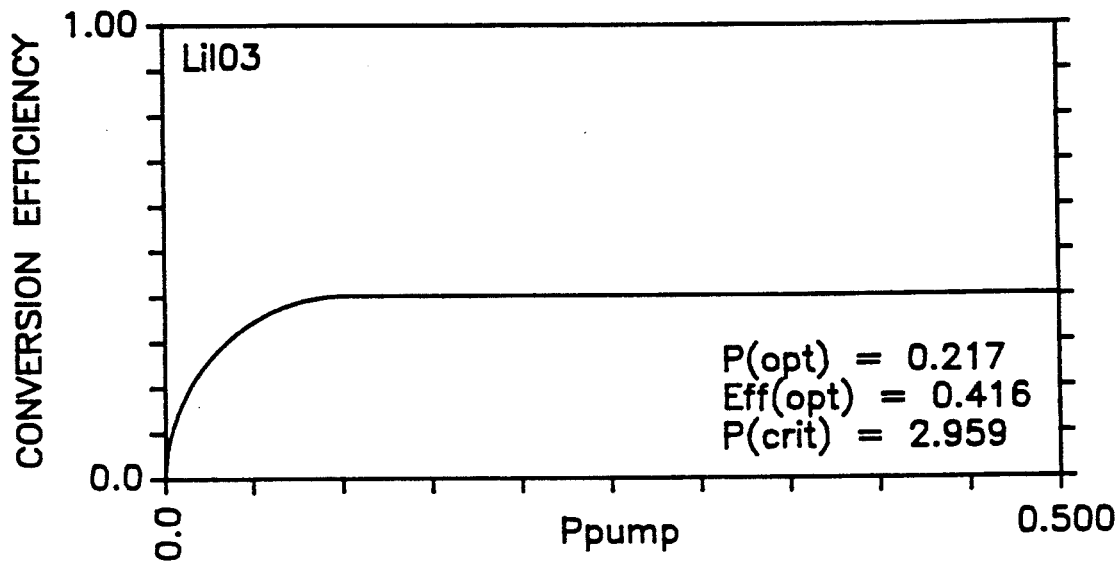
FIG. 3 shows the conversion efficiency of an example $LiIO_3$ doubler as a function of the pump power, demonstrating the early stabilization of power fluctuations inherent in the invention.

As the pump power approaches the optimum value, the sensitivity of the output power to fluctuations in the input power diminishes steadily as shown in FIG. 3 where the fundamental and second harmonic losses are 2% and 4%, and the transmissions are 1.2% and 2.7%, respectively. This optimum value occurs approximately where the intracavity conversion loss equals the transmission of the input coupler, for "impedance matched" transmission. In the case illustrated by FIG. 3, the power stabilization has taken almost its full effect at 50 mW of pump power. In the prior art, the power at which stabilization takes place exceeds the reach of available CW solid state laser technology. In addition to increasing the conversion efficiency, the invention makes possible the stabilization of the generated power at a value accessible with present-day lasers.

FIG. 2 is an alternative embodiment of the invention with a linear cavity and an absence of optical feedback. An optical pump means 38 consisting of a laser source 31 mounted on a heat sink assembly 35 pumps a frequency conversion means 49. The laser source 31 emits a coherent optical beam 32, which is collimated, astigmatically compensated, and mode matched into a symmetric linear resonator cavity 206 between mirrors 36 and 37 by lens system 33. The symmetric linear resonator 206 is formed by two curved mirrors 36 and 37 which are coated for high reflection at two wavelengths, as shown in FIG. 11. Mirror 36 has additional transmission at the input wavelength and mirror 37 has additional transmission at the output wavelength to optimize the input coupling and the output coupling, respectively. The radius of curvature R of the mirrors and the cavity round trip path length L are chosen so that the cavity is stable, i.e. so that $(1-L/2R)<1$. The input beam 32 is polarized with its electric vector along an ordinary axis of the nonlinear crystal 39. Crystal controlling means 51 is configured as described above for crystal controlling means 21 in FIG. 19. The cavity mirrors are aligned to form a closed optical path 42 for the input beam so that a low order Gaussian beam builds up in the cavity. The alignment mirrors 55 and 56 are used to align the axis of the input beam 32 to overlap with the axis of the path 42. As in FIG. 1, the heat sink assembly 35 removes the waste heat from the laser source 31 and controls the operating temperature and the drive current of the laser.

Isolator 34 permits the optical beam 32 to propagate into the resonator cavity, but blocks any return beam from passing from the cavity into the laser. The purpose of the isolator 34 is to prevent the laser from locking to the light which is reflected from the mirror 36. It also eliminates the destabilizing effects which occur when an uncontrolled partial retroreflection from mirror 36 is allowed to couple back into the laser.

The cavity design is selected, as described in equations (6) through (8), so that a closed path 43 exists for the extraordinary beam, and the segment of that path 41 inside the crystal again overlaps the acceptance region in phase space for nonlinear interaction with the segment 40 of the ordinary beam. Portion 45 of the ordinary beam 42 which is transmitted through the output mirror 37 is separated from the harmonic output beam 44 by a dichroic mirror 47 and detected in detection system 50. Detection system 50 is similar to element 19 of FIG. 1. The length adjuster system 48 is configured as described above for element 22 in FIG. 1, with the addition of a motorized translation stage (not shown) with its own control input and control electronics to allow wide-range continuous wavelength adjustment. The length adjuster system 48 is used to adjust the cavity length, and drive current to the laser source 31 is used to adjust emission wavelength.

The longitudinal modes of the cavity are adjusted relative to the wavelength of the laser by actuating the length adjuster system 48. The cavity length is adjusted so that the optical frequency of the laser overlaps the optical frequency of the cavity mode as shown in FIG. 10(c) and power buildup occurs in the cavity in the ordinary beam 42. The relative wavelength can be locked to zero with feedback if the either the laser current or the cavity length is modulated. As described above a Pound-Drever error signal is generated from the detector system 50, and connected to the input on either the laser current or the cavity length with the phase set to cancel any error in the relative wavelength.

The angle and temperature of the nonlinear crystal 39 are adjusted to achieve phase matching for power flow from the ordinary beam 42 into the extraordinary (harmonic) beam 43 which builds up in the cavity. For optimum performance, the crystal 39 is optimally located at the waist of the beam 42, and its surfaces are anti-reflective coated for both the pump wavelength and the harmonic wavelength. As before, the temperature regulation system 54 is adjusted to bring the generated harmonic onto resonance in the cavity so that power builds up in the extraordinary beam 43.

As above, it is desirable to control the oven temperature in a feedback loop to lock the cavity resonance at the harmonic wavelength onto the generated wavelength, stabilizing the power buildup. This is done by dithering the oven temperature, detecting a portion of the harmonic power which emerges from the cavity, and maximizing the emerging power. The portion 46 of the extraordinary generated beam 43 which is transmitted through the input mirror 36 is separated from the input beam 32 by a dichroic mirror 53 and detected in detection system 52 which is similar to element 19 in FIG. 1. The error signal which is derived in detection system 52 is applied to the oven temperature control input.

One advantage obtained through this invention is that the critically-phase-matched nonlinear interaction can be angle-tuned. As a result, a wide range of frequencies are available from a single type of nonlinear material. For example, $LiIO_3$ can be adjusted to phase match all wavelengths between 700 and 630 nm by rotating the angle of the crystal through 12 degrees. In contrast, the material rubidium dihydrogen arsenate (RDA), which is non-critically phase matched for doubling near 695 nm, tunes over only 11 nm when the temperature is changed by 80 degrees.

According to the invention, relatively low-powered solid state lasers can be used as the optical pump. The CW power available from conventional solid state lasers ranges from about 100 mW to about 1 W, while dye lasers and ion lasers produce CW power in the range from 1 W to 10 W and above, at a single frequency, or about 30 times more than solid state lasers. The nonlinear converted power available from solid state lasers is therefore lower than from other laser technology by the square of this factor, or three orders of magnitude. Improved conversion efficiency according to the invention has made it possible to consider the use of solid state lasers in nonlinear conversion, something heretofore never contemplated.

Several technical factors are responsible for this improvement. First, the overlap factor between the beams has been improved, as shown in FIGS. 15 and 16, by allowing the beams to cross completely inside the crystal, rather than starting on the same axis and diverging from there at the walkoff angle. This effect improves the conversion efficiency by a factor of about two. Second, in a ring cavity, the round trip cavity losses have been reduced by a factor of two because the beam traverses the crystal, the major source of optical loss, only once instead of twice. Since the conversion efficiency varies as the square of the buildup factor at the fundamental, and linearly with the buildup factor at the harmonic, this factor of two improvement results in an octupling of the conversion efficiency. Perhaps most important of all, this technique allows the use of crystal materials which have a high nonlinear coefficient and low loss, but which require critical phase matching. $LiIO_3$, for example, has a nonlinear coefficient which is more than five times that of RDA. The conversion efficiency increases as the square of the nonlinear coefficient, all other factors being equal.

As a variation on the configuration described in FIG. 1, the error signal for controlling the optical feedback can be derived from the Pound-Drever approach, provided that the feedback phase is modulated so that an error signal can be generated to control the mean feedback phase. The error signal is derived in detector 17 or 50, respectively. Detector systems 17 and 50 consist of optical collection means, a detector, and electronics for generating an error signal similar to element 19 in FIG. 1. The modulation of the feedback phase should be at a frequency much higher than the bandwidth of the phase feedback loop and different from the frequency of the relative wavelength modulation on the length adjusting system 18 or 48. For system stability, care must also be taken that the harmonics of the modulation frequencies do not overlap. As a further variation, two different error signals may be used for the phase and the frequency loops.

As a further variation, different nonlinear materials may be used, and different pump wavelengths. For example, a $KNbO_3$ crystal can be used with a 980 nm diode laser pump to produce a 490 nm doubled output. Many other options are available, selecting among low loss nonlinear crystals, and moderate power, relatively narrowband laser sources.

As a further variation, the phase matching angle of the crystal can be controlled automatically through the crystal control means 21 or 51 with a feedback loop. The angle is dithered at a unique frequency, an error signal is developed in detector system 19 or 52, and the signal is fed back to the control input of the crystal control means 21 or 51 so as to maximize the generated power circulating in the cavity.

Figure 18:
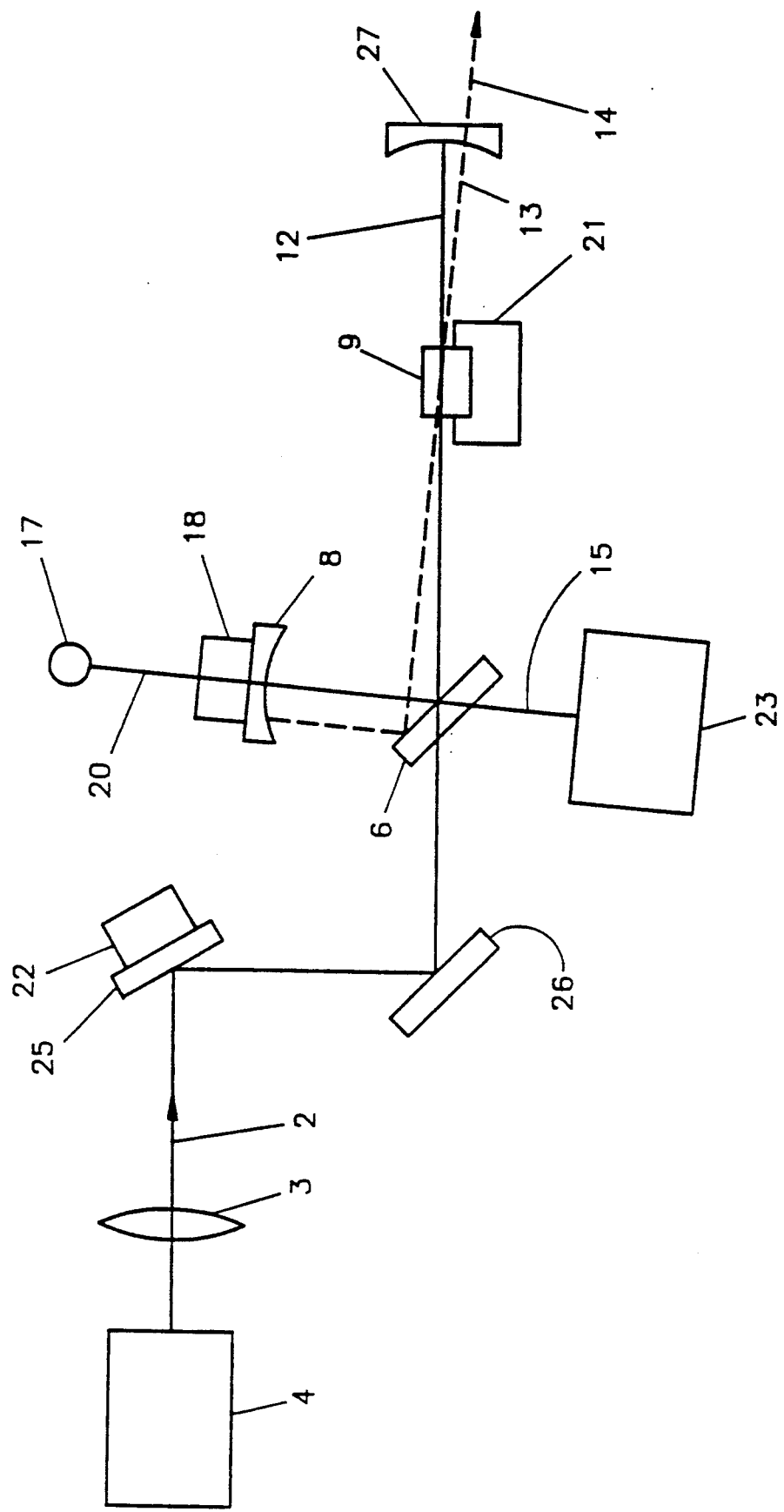
FIG. 18 is a schematic diagram of an alternative embodiment of the invention which illustrates a dual resonant bidirectional cavity nonlinear converter with optical feedback.

As a further variation, the resonator does not need to be symmetric. The lengths of the three legs of the resonator in FIG. 1 can be different, and the mirror curvatures in FIG. 2 can be different. By adjusting the longitudinal location of the nonlinear crystal, it is still possible to obtain zero beam crossing separation. The resonator may also have additional curved or flat mirrors, including folded layouts such the bidirectional configuration of FIG. 18 and the "bow-tie" configuration of FIG. 13, provided that the constraints of equation (8) and (5), respectively, produce acceptable phase space overlap for the nonlinear interaction. In FIG. 18, the end mirror 27 is coated for high reflectivity at the two wavelengths as shown in FIG. 11, with additional transmission for the generated wavelength. The other aspects of the setup and the functioning are similar to those described in FIG. 1.

Figure 21:
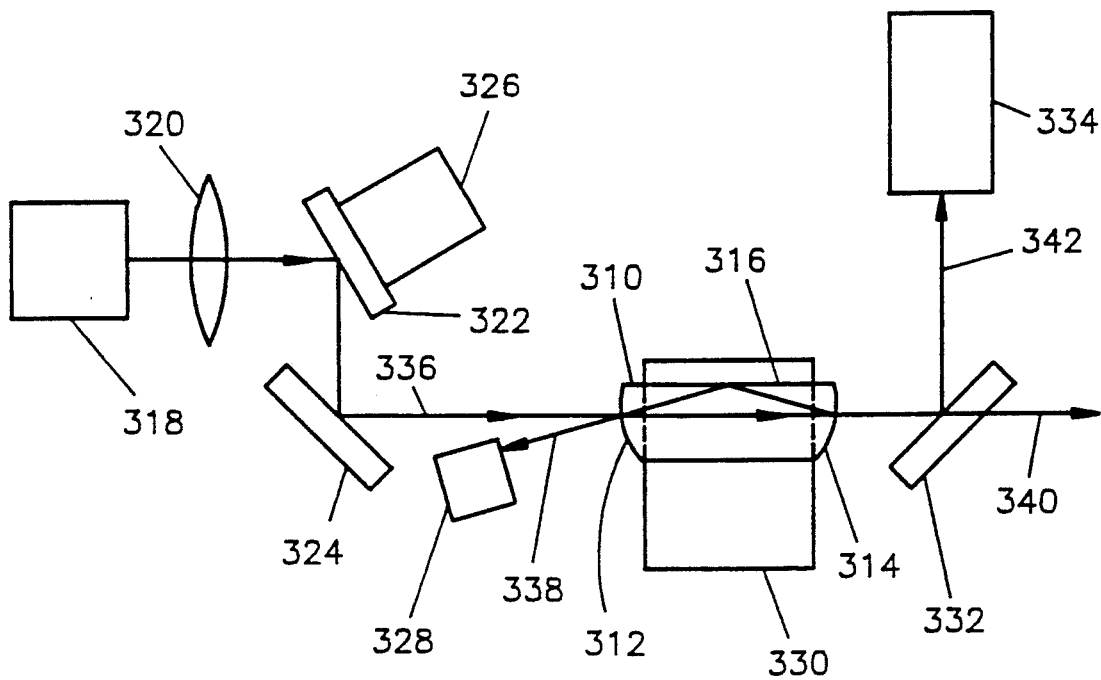
FIG. 21 is a schematic diagram of an alternative embodiment of the invention which illustrates a monolithic dual resonant nonlinear converter.

As a further variation, the resonator can be monolithic as shown for example in FIG. 21. The cavity mirrors 312, 314, and 316 are fabricated on the sides of a block of nonlinear material 310. An optical pump means 318 similar to element 4 of FIG. 1 produces optical beam 336 which is aligned, compensated, and mode matched into the resonator mode as described above with lens system 320 and alignment mirrors 322 and 324. Length adjusting system 326 has structure similar to element 22 of FIG. 1, and is used to adjust the optical phase of the optical feedback from the monolithic resonator into the optical pump means 318. The reflected and transmitted beam 338 is analyzed with the helicity detector 328 as described above to generate an error signal. The error signal is used as described above to center the emission wavelength of the optical beam 336 on a longitudinal mode of the monolithic cavity so that power buildup occurs. The cavity mirrors 312, 314, and 316 are coated for high reflectivity at both the pump frequency and a generated frequency, and the input coupler 312 has additional transmission at the pump frequency to optimize the power coupling into the resonator, and the output coupler 314 has additional transmission at the output frequency to optimize the output power coupling.

The radius of curvature of the mirrors and the optical path length in the monolithic resonator are adjusted as described by equation (5) so that the closed optical path of a generated beam overlaps the pump beam in the resonator within the phase space acceptance of the nonlinear conversion process. The crystal control means 330 has structure similar to element 21 in FIG. 19, and is used to optimize the nonlinear conversion. The crystal is rotated about an axis parallel to the polarization of the ordinary wave in the crystal in order to adjust the optical path length at a generated frequency substantially independently of the optical path length at the pump frequency so that optical buildup occurs at both frequencies simultaneously. Pickoff mirror 332 reflects a fraction of the output beam into beam 342 which enters the detector system 334 which has structure similar to element 19 of FIG. 1. The path length adjustment with the crystal angle is made automatic with a feedback loop using a modulation of the crystal angle to generate an error signal generated in detector system 334, which is connected to the control input on the crystal angle to reduce any accumulated angular errors, producing a maximum power and stability in the output beam 340.

As a variation which we include in the group of alternative monolithic designs, a single mirror, such as the curved mirror 8 or 37, can be retained as an independent unit which is joined to the monolithic crystal with a small air gap, an AR coating, or with index matching fluid. This has the advantage of allowing significant additional flexibility while not adding to the complexity of the system.

Figure 4:
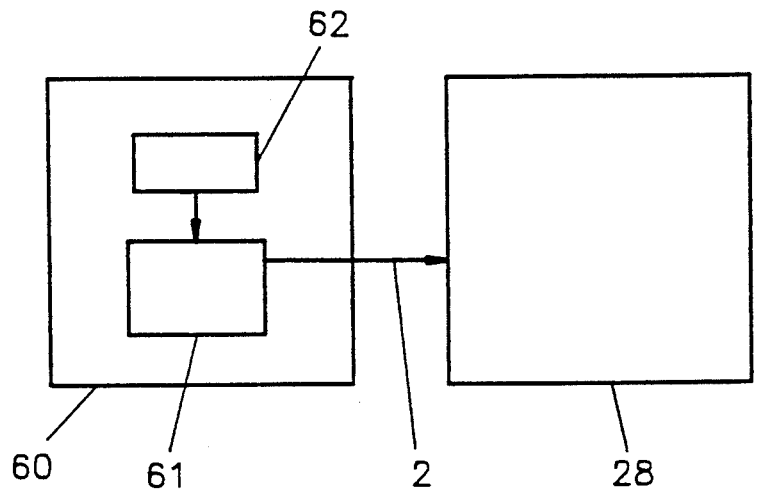
FIG. 4 is a schematic block diagram of another embodiment of the invention which illustrates a diode pumped solid state pump laser and a ring resonator.

As a further variation, shown in FIG. 4, an optical pump means 60, which pumps the frequency conversion means 28, contains a solid state laser assembly 61 pumped by a diode assembly 62.

Figure 5:
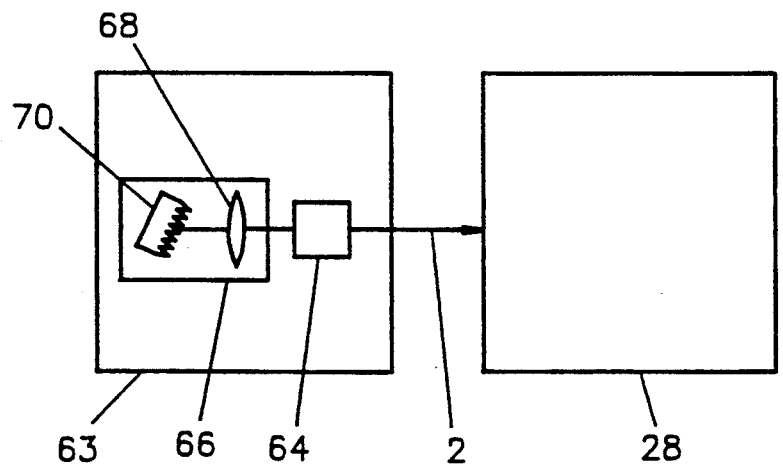
FIG. 5 is a schematic block diagram of another embodiment of the invention which illustrates an external cavity stabilized diode laser pump and a ring resonator.

As a further variation, shown in FIG. 5, an optical pump means 63, which pumps the frequency conversion means 28, contains a diode laser 64 stabilized with an external resonator assembly 66. The external resonator assembly contains a collimating lens 68 and a grating feedback element 70 in Littrow configuration to control the operating wavelength of the diode laser 64. The facet of the laser facing the grating, is preferably antireflection (AR) coated at least to the degree needed to permit continuous tuning of the laser frequency when the grating is rotated and translated as is known in the art. The grating stabilization of the diode laser permits tuning over a large fraction of its gain curve so that the output of the frequency conversion means 28 can be tuned over the largest possible range.

Figure 6:
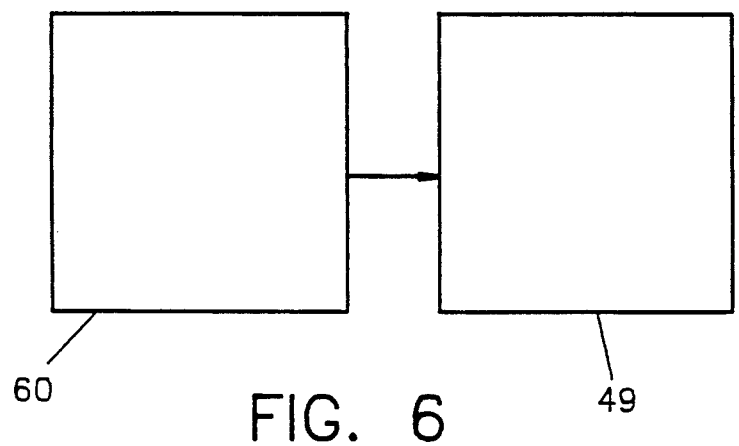
FIG. 6 is a schematic block diagram of another embodiment of the invention which illustrates a diode pumped solid state pump laser and a linear resonator.
Figure 7:
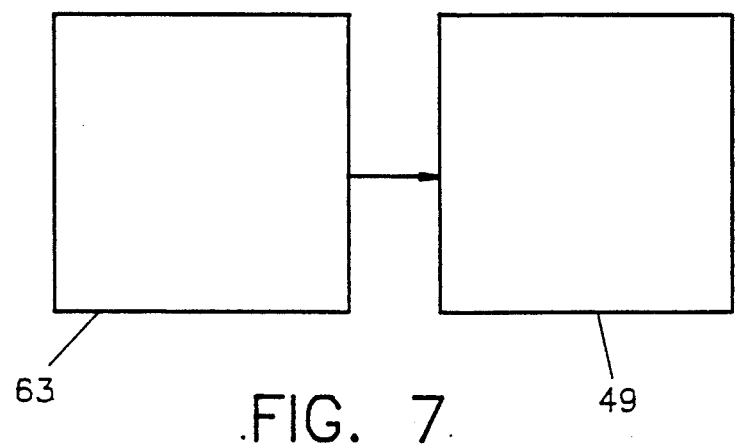
FIG. 7 is a schematic block diagram of another embodiment of the invention which illustrates an external cavity stabilized diode laser pump and a linear resonator.

As a further variation shown in FIGS. 6 and 7, the above-described optical pump means 60 or 63, respectively, pumps the above-described frequency conversion means 49.

Figure 8:
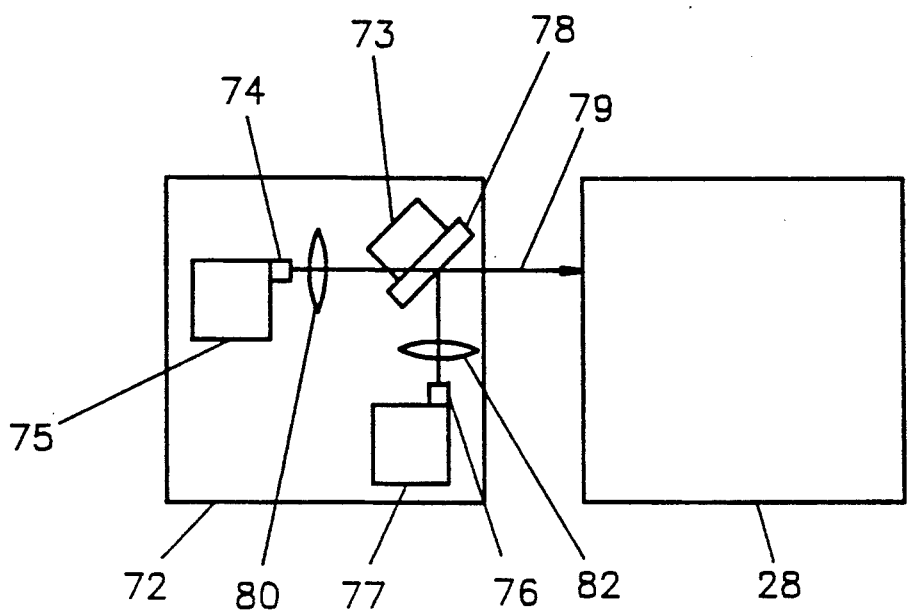
FIG. 8 is a schematic block diagram of another embodiment of the invention in which the optical pump means includes two diode laser pumps and a ring resonator.
Figure 12:
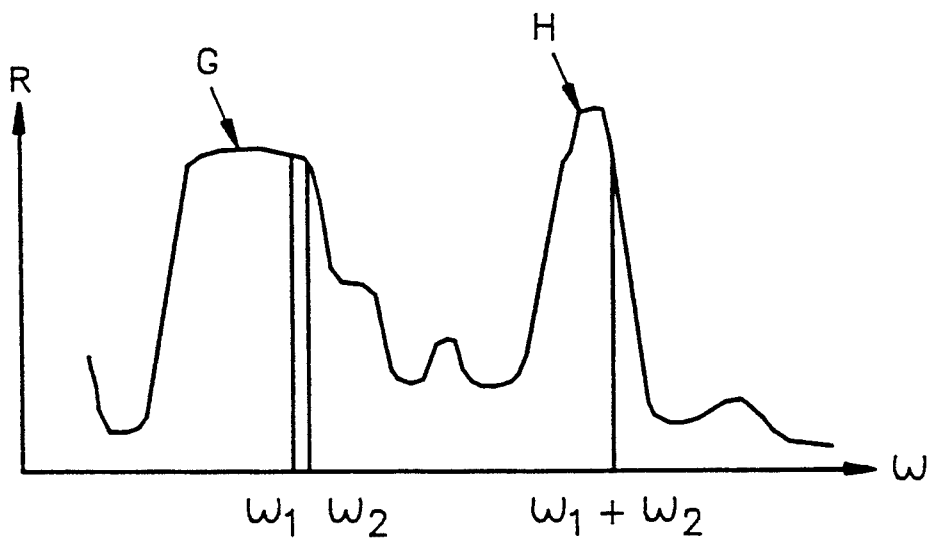
FIG. 12 is a diagram of a mirror reflection curve as a function of frequency which is useful for dual resonant mixing wherein the reflectivity of the cavity mirrors (not including the transmission of the input coupler and the output coupler) is shown to be high for both the input frequencies and the sum of the two frequencies.

As a further variation shown in FIG. 8, a dual resonant optical mixer is configured as an optical pump means 72 for pumping the frequency conversion means 28. The pump means 72 contains two diode lasers 74 and 76 mounted on two heat sink assemblies 75 and 77, and two lens assemblies 80 and 82. The beams emitted by the diode lasers 74, 76 are combined by the beamsplitter 78, which is a dichroic mirror configured for high transmission at the emission wavelength of diode laser 74, and for high reflection at the emission wavelength of diode laser 76. The two beams are combined onto the same axis 79, and the two lens assemblies 80 and 82 are adjusted to produce the same transverse mode characteristics so that they are accepted into the frequency conversion means with low loss. The frequency conversion means contains resonator mirrors as described above, with high reflection in two wavelength regions as illustrated in FIG. 12, and additional transmissions as described above.

If the polarization vectors of the two wavelength components of the beam 79 are the same, they are both selected to lie in the ordinary plane of the nonlinear crystal 9 and aligned to pump the ordinary cavity mode (beam path 12 FIG. 1). As shown in FIG. 12, the optical frequencies $\omega_1$ and $\omega_2$ both lie within the high reflection region G of the mirror coatings, as is the output frequency, $\omega_1 + \omega_2$ (region H). The crystal 9 is then adjusted in temperature and angle to phase match the conversion of power out of the two ordinary input beams into the extraordinary output beam at the optical frequency which is the sum of the optical frequencies of the diodes 74 and 76. As before, the input and output couplers have the transmission adjusted to be optimum at the input and output frequencies, respectively.

The frequency conversion means 28 (FIG. 8) is adjusted as before, except that two error signals may be derived from the power circulating in the cavity instead of just one. A dichroic beamsplitter is used to divide one of the beams 15 or 20 (FIG. 1) into the two pump wavelength components so that two locking error signals are generated in two different detection systems. One of these components is applied as described above, and the other is applied to the second diode laser to lock it to the nearest desired cavity mode, which accomplishes simultaneous resonance for the two pump lasers. In FIG. 8, optical feedback stabilization may be used as described above for the first diode laser 74, and also for the second diode laser 76 in a similar way. PZT adjustment system 73 is provided to allow independent adjustment of the optical phase of the feedback beam to diode 76, which may be controlled in a similar way as the optical phase of the feedback to the diode 74.

The variations described for FIG. 1 are also relevant to the mixing configuration of FIG. 8. As a further variation on the configuration of FIG. 8, the beamsplitter 78 may be a polarization beamsplitter cube, in which case the beam 79 contains two orthogonal polarizations at the wavelengths of the two diode lasers. The phase matching of the nonlinear crystal 9 is thereupon optimally of the Type II variety. In such a case the beam 79 has two spatial components, with the ordinary polarized spatial component being aligned to the ordinary mode (path 12), and the extraordinary polarized component aligned to the extraordinary mode (path 13). The two spatial components can each be expanded in a complete set of Gaussian modes about the chosen axis of the input beam, which is most simply the axis of the ordinary polarized component. If the angle between the two modes is large enough, it is possible to combine the two diode laser beams into their two spatial components with a mirror (not shown) in the place of the beamsplitter 78, but displaced to allow the spatial component emitted from the laser 74 to pass by unaltered.

If the wavelengths of the two pump diodes are widely enough separated, the coatings on the mirrors 6, 7 and 8 (FIG. 1) must be modified to obtain a triply-resonant cavity. Their reflectivity at the wavelengths of the generated beam and the diode 74 remain as described above. However, the cavity must also build up power at the wavelength of the diode 76. In addition to the above described constraints, the reflectivity of mirrors 7 and 8 must be made large to minimize the cavity losses at the wavelength of the laser 76, and the transmission of the input coupler 6 should match the other operating losses of the cavity at the same wavelength.

As a further variation for the triply resonant mixer, the second pump diode laser 76 (FIG. 8) is matched into the resonant cavity through another mirror such as mirror 8 (FIG. 1). Mirror 8 then becomes the input coupler for the beam from laser 76 instead of mirror 6, and an additional optical transport, and a matching assembly is needed between the laser 76 and the new input coupler (mirror 8).

Figure 9:
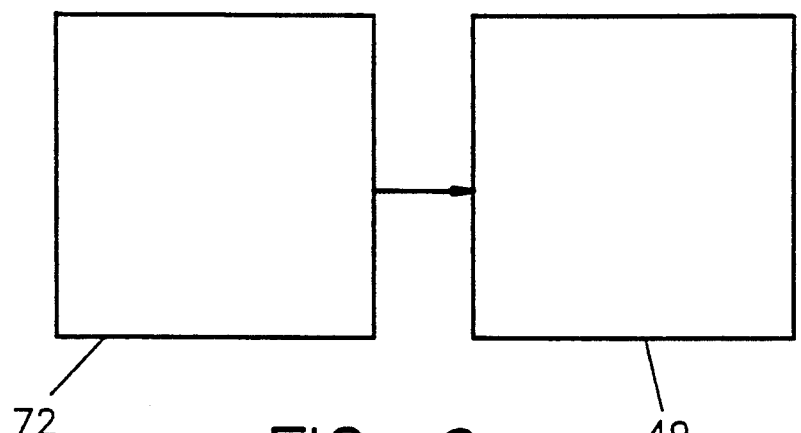
FIG. 9 is a schematic block diagram of another embodiment of the invention in which the optical pump means includes two diode laser pumps and a linear resonator.

As a further variation shown in FIG. 9, a dual resonant optical mixer is configured with the above described optical pump means 72 for pumping the frequency conversion means 49. The polarizations are arranged as described above. The variations described above (with the exception of optical feedback) are also applicable to FIG. 9, with appropriate adjustments for the linear cavity configuration.

In the descriptions of FIGS. 1, 2, and 4 through 9, the system has been in configured as a doubler or a mixer. However, the same approaches for realizing dual or triple resonant cavities including birefringent materials are also applicable to optical parametric oscillators (OPOs). In the OPO, the input beam is the high frequency beam, which for negative birefringent crystals with positive dispersion is phase matched in the extraordinary plane. The two output beams are either both in the ordinary plane (Type I), or one in each of the extraordinary and the ordinary planes (Type II). The OPO resonator configurations are identical to those of the figures above, with differences in the selection of and phase matching of the crystal, the mirror reflectivity, and the wavelength sensitivity of the detectors. In FIG. 1, for example, the crystal 9 may be $AgGaS_2$. With a pump laser 1 operating at 780 nm, the crystal phase matches at 90 degrees for the generation of 3.35 and 1.02 microns. By tuning the angle of the crystal to 60 degrees, the idler wave can be tuned between 3.35 microns and 5 microns.

The cavity mirrors may be designed for resonance at the pump wavelength and at one of the generated waves, preferably the signal wave at 1.02 microns. Stable closed orbits may be obtained as described above, but beam 12 will be the extraordinary beam, and beam 13 the ordinary beam. The optimization process herein described for the cavity design results in an increase in the conversion efficiency and stability of the OPO by overlapping the pump beam into the acceptance region in phase space for the generation of the two longer wavelength beams. The crystal is AR coated for the same two wavelengths, placed at the crossing point of the two beams near their foci, and temperature and angle adjusted to obtain phase matching. Power builds up in beam 13 at at least one of the two generated wavelengths, and the desired wavelength is outcoupled through mirror 7 into beam 14.

In further variations, the linear resonator of FIG. 2 or any of the cavity variations can be employed with any pump laser or nonlinear crystal for the optical parametric oscillator.

The structure for achieving simultaneous resonance at two different frequencies in a dually resonant cavity is important enough to stand independent of the nonlinear conversion means. As shown in FIG. 13, a pump laser 101 mounted on a heat sink assembly 105 produces an output beam 102. The output beam is collimated, astigmatically compensated, and mode matched into the resonator by the lens system 103. Alignment mirrors 125 and 126 adjust the axis of the beam 102 to overlap the axis of the mode 112. The resonant cavity is chosen in this example to be a bow tie cavity formed by mirrors 106, 107, 108, and 109, which are highly reflective at at least the wavelength of the laser 101. The input coupler 106 has additional transmission to optimize the input coupling, and the helicity detector 123 is used to derive an error signal proportional to the difference between the laser wavelength and the longitudinal mode wavelength.

The cavity mirrors are aligned to form a closed mode beam path 112. Utilization means 110 is mounted in control means 121 and selected to perform its function, which may be one of a variety of applications. For illustration, the utilization means 110 may be a crystal phase matched for mixing where two high power beams must traverse the nonlinear crystal to produce a high enough conversion into the output frequency. In this case, a separate pump laser 171 mounted on a heat sink assembly 175 produces an output beam 172 which is collimated, astigmatically compensated and mode matched into the resonator by the lens system 173. Alignment mirrors 195 and 196 adjust the axis of the beam 172 to overlap an axis of the mode 112. As before, the resonator is highly reflective at the wavelength of the pump laser 171, and the input coupler 108 has additional transmission at the frequency of the pump laser 171 to optimize the input coupling, and the helicity detector 193 is used to derive an error signal proportional to the difference between the wavelength of the laser 171 and the desired longitudinal mode wavelength.

If the pump lasers 101 and 171 have fixed frequencies which cannot be independently adjusted, or if they are frequency locked to each other as in the case of offset locking, the cavity must be adjusted to provide simultaneous resonance. The length adjusting system 118 is used to lock one of the longitudinal modes of the cavity to the frequency of only one of the pump lasers, such as laser 101. The temperature regulation system 124 which has structure similar to element 24 in FIG. 1 is then needed to bring the second laser relative wavelength on resonance for buildup as described above for FIG. 10. The temperature regulation system 124 provides an independent adjustment of the longitudinal mode nearest the second pump laser 171. Since the degree of independence of the two signals grows with wavelength separation, this technique is most useful where the wavelengths of the two pump lasers are widely separated.

As a variation of the structure shown in FIG. 13, it is useful in some cases to use temperature adjustment of the optical path length even when only a single optical pump source 101 is present, and elements 171, 172, 173, 175, 193, 195 and 196 are absent. FIG. 13 shows a case where optical feedback is not used. If the optical pump is a diode laser, it is useful to include an isolator (not shown) in the lens system 103.

The dual phase and wavelength control of the optical feedback described in FIGS. 1, 4, 5, 8 and 17 can be varied in several ways while achieving the same purpose. The cavity length can be locked to the laser emission frequency instead of vice versa. The basic error signal can be a Pound-Drever type error signal extracted from the detector system 117, or it can be a hybrid of both types of error signal. The control signals may be applied to the length adjusting systems 122 and 118 or to the diode laser drive current input or the temperature input in 105 or to combinations of these inputs. The frequency components of the error signal used may also vary, as for example if the fourth harmonic of the dither frequency is used as the basis for the second error signal, or if the bandwidths are adjusted. The cavity used may be varied as is known in the literature, from a linear folded cavity, to a ring cavity, to a linear cavity with the feedback signal injected through the polarizer element of the isolator.

Figure 17:
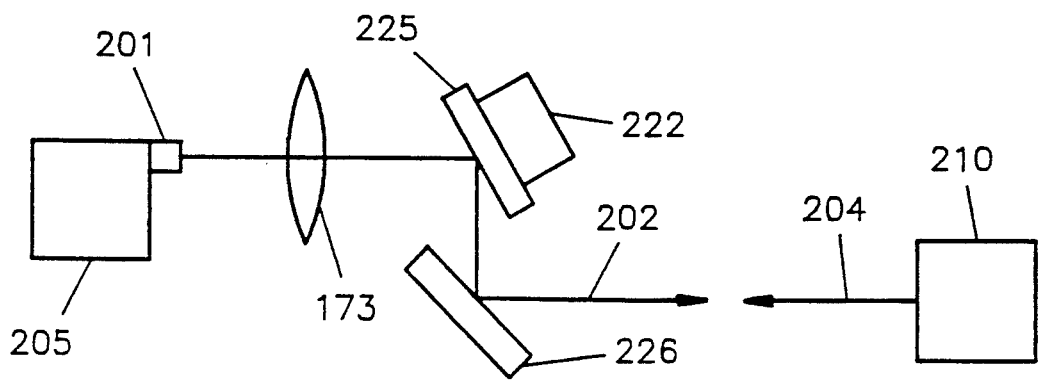
FIG. 17 is a schematic diagram of an alternative embodiment of the invention in which an injection locked pump laser is controlled independently and simultaneously through the relative frequency of the laser and through the relative phase of the feedback.

The two-loop control system for the optical feedback is also important enough in its own right to be considered independent of the dual resonant technology. As shown in FIG. 17, a diode laser 201 mounted on a heat sink assembly 205 produces an output beam 202. The output beam is collimated, astigmatically compensated, and mode matched as desired for the application by the lens system 203. Alignment mirrors 225 and 226 adjust the axis of the beam 202.

The emission frequency is controlled, as described above, by optical feedback. The desired optical control beam (which might be a portion of the power built up in a resonator cavity not including the direct reflection of an input mirror) is coupled into the reverse propagating beam 204. Part of the power in beam 204 follows the reverse optical path all the way into the active region of the laser 201. As described above, this beam tends to injection lock the laser near the desired wavelength. The length adjusting system 222 adjusts the phase of the return beam. The lens system 203, the heat sink assembly 205, and the length adjusting system 222 are similar to the elements 3, 5, and 22 described in reference to FIG. 1.

If the free running wavelength of the diode laser is close enough to the desired wavelength, the diode laser will injection lock near the desired wavelength within a certain range of phase of the return beam. The phase of the return beam is adjusted by a feedback loop as described above, using an error signal derived in the utilization means 210 from the wavelength difference between the beams 202 and 204. The low frequency portion of the error signal is generated as in line 274 of control electronics 270 (FIG. 20) and is used to control the feedback phase so that the laser output wavelength is locked to the desired wavelength.

Simultaneously, a second feedback loop is implemented as described above to adjust the free running diode laser wavelength so that the mean phase of the return beam lies within the central portion of its stability region. The diode laser wavelength is dithered by modulating the feedback phase with length adjusting system 222. The dither frequency is higher than the inverse response time of the phase feedback loop so that the mean phase is unaffected by the dither. A second error signal is derived from the error signal at the second harmonic of the dither frequency by means such as line 276 of control electronics 270 of FIG. 20. This second error signal is applied to the diode laser drive current input in 205 to adjust its mean free running wavelength in a stable feedback loop. As before, the bandwidth of the signal which controls the diode laser wavelength is much lower than the bandwidth of the loop controlling the phase of the optical feedback.

While the invention has been particularly shown and described with reference to preferred embodiments thereof, it will be understood by those skilled in the art that the foregoing and other changes in the form and details may be made therein without departing from the spirit or scope of the invention.

What is claimed is:

1. An apparatus for generating an optical output beam, the apparatus comprising:
   a solid state laser pump means for producing a first optical beam along a first defined axis, said first optical beam having a first preselected spectrum having at least one spectral peak;
   a resonator cavity means coupled to receive said first optical beam from said solid state laser pump means, for supporting buildup of selected optical power in a first spectral range including said first preselected spectrum and in a second spectral range, said resonator cavity means being disposed to have an axis coincident with said first optical beam for admitting a portion of said first optical beam;
   first means for adjusting at least one longitudinal mode in said first spectral range of said resonator cavity means relative to said at least one spectral peak of said optical pump means in response to a first control input in order to achieve buildup of optical power at said at least one longitudinal mode;
   a nonlinear optical element means disposed in said resonator cavity means, which is adjustable to phase match at least two optical beams through said nonlinear optical element means, for generating a second optical beam with a preselected frequency along a second defined axis at least partially overlapping said first defined axis; and
   second means for adjusting a second longitudinal mode in said second spectral range of said resonator cavity means relative to said preselected frequency of said second optical beam in response to a second control input in order to achieve buildup of optical power at said preselected frequency for producing an optical output.

2. The apparatus according to claim 1 wherein said solid state laser pump means includes at least one diode laser pump.

3. The apparatus according to claim 1 wherein said solid state laser pump means includes at least one external-cavity stabilized diode laser pump.

4. The apparatus according to claim 1 wherein said solid state laser pump means includes at least one external-cavity stabilized diode laser pump with stabilizing grating.

5. The apparatus according to claim 1 wherein said solid state laser pump means includes at least one diode-pumped solid state laser pump.

6. The apparatus according to claim 1 wherein said preselected spectrum contains a preferred spectral peak, and said preselected frequency is equal to twice the frequency of said preferred spectral peak, such that the apparatus defines a doubler.

7. The apparatus according to claim 1 wherein said preselected spectrum contains two preferred spectral peaks, and said preselected frequency is equal to the sum of the frequencies of said two preferred spectral peaks, such that the apparatus defines a mixer.

8. The apparatus according to claim 1 wherein said resonator cavity means is a unidirectional propagation cavity defined by at least one concave reflecting surface and at least two other reflecting surfaces, none of said concave reflecting surfaces and said other reflecting surfaces being disposed to reflect an incident beam along a normal.

9. The apparatus according to claim 8 wherein said unidirectional propagation cavity is a three-reflection ring having a first planar reflecting surface and a second planar reflecting surface.

10. The apparatus according to claim 8 wherein said unidirectional propagation cavity is a bow-tie cavity having four reflecting surfaces in folded-path configuration.

11. The apparatus according to claim 1 wherein said resonator cavity means is a bidirectional propagation cavity defined by at least one concave reflecting surface and at least one other reflecting surface, at least two reflecting surfaces in said cavity being disposed to reflect an incident beam along a normal.

12. The apparatus according to claim 11 wherein said bidirectional propagation cavity is a plano-concave cavity.

13. The apparatus according to claim 11 wherein said bidirectional propagation cavity is a concave-concave cavity.

14. The apparatus according to claim 1 wherein said resonator cavity means is monolithic.

15. The apparatus according to claim 1 wherein said first control input is a first feedback signal which is responsive to a first error signal derived from measurement of the optical power at the wavelength of said at least one spectral peak in said resonator cavity means.

16. The apparatus according to claim 1 wherein said first means for adjusting includes a piezoelectric translator mounted to one of the reflectors which comprise said resonator cavity means, said piezoelectric translator for modifying round trip optical path length at the wavelength of said at least one longitudinal mode.

17. The apparatus according to claim 1 wherein said first means for adjusting includes optical feedback means wherein said first control input is a portion of the power built up in said resonator cavity means at the wavelength of said at least one longitudinal mode, which is coupled back into the output of said solid state laser pump means with an adjustable phase and an adjustable amplitude to injection lock said at least one spectral peak to a wavelength within the bandwidth of said at least one longitudinal mode.

18. The apparatus according to claim 17 wherein a portion of a third control input controls at least said adjustable phase to maintain the frequency of said at least one spectral peak within a feedback error difference of the central frequency of said at least one longitudinal mode.

19. The apparatus according to claim 18 wherein a portion of a fourth control input also controls the relative free-running wavelength of said solid state laser pump means, which is the wavelength of said at least one spectral peak in the absence of said optical feedback means, relative to the wavelength of said at least one longitudinal mode so that perturbations of both said adjustable phase and said relative free-running wavelength are compensated substantially independently.

20. The apparatus according to claim 1 wherein radius of curvature and separation of the mirrors forming said resonator cavity means are selected so that the angle formed between said first defined axis and said second defined axis in said nonlinear optical element means equals a characteristic walkoff angle within an angular deviation smaller than the acceptance angle for nonlinear conversion in said nonlinear optical element means.

21. The apparatus according to claim 20 wherein said nonlinear optical element means is adjustable so that radiation generated from the square of the electric field of said first optical beam is phase matched with said second optical beam.

22. The apparatus according to claim 20 wherein polarization of said second optical beam lies approximately in a plane formed by the optical axis of said nonlinear element and a characteristic wavevector of said at least one longitudinal mode, forming an extraordinary beam, and polarization of said first optical beam is approximately orthogonal to polarization of said second optical beam, forming an ordinary beam, such that said nonlinear element means provides Type I phase matching between the two beams.

23. The apparatus according to claim 1 wherein said second control input is a second feedback signal which is responsive to a second error signal derived from measurement of the optical power at said preselected frequency in said resonator cavity means.

24. The apparatus according to claim 1 wherein said second adjusting means includes an adjustable optical path length means in said resonator cavity means which adjusts the optical path length of said second optical beam relative to the optical path length of said first optical beam, such that buildup at said preselected frequency is supported by said resonator cavity means at the same time as buildup at said at least one longitudinal mode.

25. The apparatus according to claim 24 wherein said adjustable optical path length means is said nonlinear optical element means including means for rotation of said nonlinear optical element means about the polarization vector of said first optical beam.

26. The apparatus according to claim 24 wherein said adjustable optical path length means is a means for adjusting temperature of media at selected positions within said resonator cavity means through which pass at least said second optical beam.

27. The apparatus according to claim 26 wherein said temperature adjusting means is an oven and wherein said media is air.

28. The apparatus according to claim 1 further including means for stabilizing optical power, including means for saturating output of the second optical beam to cause intracavity conversion efficiency to saturate, the intracavity conversion efficiency saturation being achieved when conversion efficiency is comparable to the fundamental cavity total loss minus transmission of an input coupling means for said optical pump means, said input coupling means being the optical input of said resonator cavity means.

29. A method for generating an optical output beam comprising the steps of:
producing a first optical beam along a first defined axis with solid state laser pump means, said first optical beam having a first preselected spectrum having at least one spectral peak;
building up selected optical power in a first spectral range including said first preselected spectrum and in a second spectral range with resonator cavity means coupled to receive said first optical beam from said solid state laser pump means, said resonator cavity means being disposed to have an axis coincident with said first optical beam for admitting a portion of said first optical beam;
adjusting at least one longitudinal mode in said first spectral range of said resonator cavity means relative to at least one spectral peak of said optical pump means in response to a first control input in order to achieve buildup of optical power at said at least one longitudinal mode;
generating a second optical beam at a preselected frequency along a second defined axis at least partially overlapping said first defined axis using nonlinear optical element means disposed in said resonator cavity means, said nonlinear optical element being adjustable to phase match at least two optical beams through said nonlinear optical element means; and
adjusting a second longitudinal mode in said second spectral range of said resonator cavity means relative to said preselected frequency of said second optical beam in response to a second control input in order to achieve buildup of optical power at said preselected frequency for producing an optical output.

30. The method according to claim 29 wherein said first control input is a first feedback signal which is responsive to a first error signal derived from measurement of the optical power at the wavelength of said at least one spectral peak in said resonator cavity means.

31. The method according to claim 29 wherein said second control input is a second feedback signal which is responsive to a second error signal derived from measurement of the optical power at said preselected frequency in said resonator cavity means.

32. An apparatus for generating an optical output beam, the apparatus comprising:
an optical pump means for producing a first optical beam along a first defined axis, said first optical beam having a first preselected spectrum having at least one spectral peak;
a resonator cavity means coupled to receive said first optical beam from said optical pump means, for supporting buildup of selected optical power in a first spectral range including said first preselected spectrum and in a second spectral range, said resonator cavity means being disposed to have an axis coincident with said first optical beam for admitting a portion of said first optical beam;
first means for adjusting at least one longitudinal mode in said first spectral range of said resonator cavity means relative to at least one spectral peak of said optical pump means in response to a first control input in order to achieve buildup of optical power at said at least one longitudinal mode, said first control input being optical feedback for injection locking at least one spectral peak of said optical pump means to said resonator cavity means, said optical feedback being derived from the optical power in said resonator cavity means;
a nonlinear optical element means disposed in said resonator cavity means, which is adjustable to phase match at least two optical beams through said nonlinear optical element means, for generating a second optical beam at a preselected frequency along a second defined axis at least partially overlapping said first defined axis; and
second means for adjusting a second longitudinal mode in said second spectral range of said resonator cavity means relative to said preselected frequency of said second optical beam in response to a second control input in order to achieve buildup of optical power at said preselected frequency, for producing an optical output.

33. The apparatus according to claim 32 wherein said resonator cavity means is a unidirectional propagation cavity defined by at least one concave reflecting surface and at least two other reflecting surfaces, none of said concave reflecting surfaces and said other reflecting surfaces being disposed to reflect an incident beam along a normal.

34. The apparatus according to claim 32 wherein said first means for adjusting includes optical feedback means wherein said first control input is a portion of the power built up in said resonator cavity means at the wavelength of said at least one longitudinal mode, which is coupled back into the output of said optical pump means with an adjustable phase and an adjustable amplitude to injection lock said at least one spectral peak to a wavelength within the bandwidth of said at least one longitudinal mode.

35. The apparatus according to claim 34 wherein a portion of a third control input controls at least said adjustable phase to maintain the frequency of said at least one spectral peak within a feedback error difference of the central frequency of said at least one longitudinal mode.

36. The apparatus according to claim 35 wherein a portion of a fourth control input also controls the relative free-running wavelength of said optical pump means, which is the wavelength of said at least one spectral peak in the absence of said optical feedback means, relative to the wavelength of said at least one longitudinal mode so that perturbations of both said adjustable phase and said relative free-running wavelength are compensated substantially independently.

37. The apparatus according to claim 32 wherein said second adjusting means includes an adjustable optical path length means in said resonator cavity means which adjusts the optical path length of said second optical beam relative to the optical path length of said first optical beam, such that buildup at said preselected frequency is supported by said resonator cavity means at the same time as buildup at said at least one longitudinal mode.

38. The apparatus according to claim 37 wherein said adjustable optical path length means is said nonlinear optical element means including means for rotation of said nonlinear optical element means about the polarization vector of said first optical beam.

39. The apparatus according to claim 37 wherein said adjustable optical path length means is a means for adjusting temperature of media at selected positions within said resonator cavity means through which pass at least said second optical beam.

40. The apparatus according to claim 39 wherein said temperature adjusting means is an oven and wherein said media is air.

41. An apparatus for generating an optical output beam, the apparatus comprising:
- a optical pump means for producing a first optical beam along a first defined axis, said first optical beam having a first preselected spectrum having at least one spectral peak;
- a resonator cavity means coupled to receive said first optical beam from said optical pump means, for supporting buildup of selected optical power in a first spectral range including said first preselected spectrum and in a second spectral range, said resonator cavity means being disposed to have an axis coincident with said first optical beam for admitting a portion of said first optical beam;
- first means for adjusting at least one longitudinal mode in said first spectral range of said resonator cavity means relative to at least one spectral peak of said optical pump means in response to a first control input in order to achieve buildup of optical power at said at least one longitudinal mode;
- a nonlinear optical element means disposed in said resonator cavity means, which is adjustable to phase match the generation of a second optical beam with a preselected frequency and a third optical beam from said at least one longitudinal mode, said first optical beam, said second optical beam and said third optical beam at least partially overlapping spatially through said nonlinear optical element means; and
- second means for adjusting a second longitudinal mode in said second spectral range of said resonator cavity means relative to said preselected frequency in response to a second control input in order to achieve buildup of optical power at said preselected frequency, for producing an optical output.

42. The apparatus according to claim 41 wherein said resonator cavity means is a unidirectional propagation cavity defined by at least one concave reflecting surface and at least two other reflecting surfaces, none of said concave reflecting surfaces and said other reflecting surfaces being disposed to reflect an incident beam along a normal.

43. The apparatus according to claim 41 wherein said first means for adjusting includes optical feedback means wherein said first control input is a portion of the power built up in said resonator cavity means at the wavelength of said at least one longitudinal mode, which is coupled back into the output of said optical pump means with an adjustable phase and an adjustable amplitude to injection lock said at least one spectral peak to a wavelength within the bandwidth of said at least one longitudinal mode.

44. The apparatus according to claim 43 wherein a portion of a third control input controls at least said adjustable phase to maintain the frequency of said at least one spectral peak within a feedback error difference of the central frequency of said at least one longitudinal mode.

45. The apparatus according to claim 44 wherein a portion of a fourth control input also controls the relative free-running wavelength of said optical pump means, which is the wavelength of said at least one spectral peak in the absence of said optical feedback means, relative to the wavelength of said at least one longitudinal mode so that perturbations of both said adjustable phase and said relative free-running wavelength are compensated substantially independently.

46. The apparatus according to claim 41 wherein said second adjusting means includes an adjustable optical path length means in said resonator cavity means which adjusts the optical path length of said second optical beam relative to the optical path length of said first optical beam, such that buildup at said preselected frequency is supported by said resonator cavity means at the same time as buildup at said at least one longitudinal mode.

47. The apparatus according to claim 46 wherein said adjustable optical path length means is said nonlinear optical element means including means for rotation of said nonlinear optical element means about the polarization vector of said first optical beam.

48. The apparatus according to claim 46 wherein said adjustable optical path length means is a means for adjusting temperature of media at selected positions within said resonator cavity means through which pass at least said second optical beam.

49. The apparatus according to claim 48 wherein said temperature adjusting means is an oven and wherein said media is air.

50. An apparatus for generating an optical output beam, the apparatus comprising:
- an optical pump means for producing a first optical beam along a first defined axis, said first optical beam having a first preselected spectrum having at least one spectral peak;
- a resonator cavity means coupled to receive said first optical beam from said optical pump means, for supporting buildup of selected optical power in a first spectral range including said first preselected spectrum, said resonator cavity means being disposed to have an axis coincident with said first optical beam for admitting a portion of said first optical beam; and
- first means for adjusting at least one longitudinal mode in said first spectral range of said resonator cavity means relative to at least one spectral peak of said optical pump means in response to a first control input in order to achieve buildup of optical power at said at least one longitudinal mode, wherein said optical path length adjusting means is a means for adjusting temperature of media through which passes at least said first optical beam at selected positions within said resonator cavity means.

51. The apparatus according to claim 50 wherein said temperature adjusting means is an oven and wherein said media is air.

52. An apparatus for generating an optical output beam, the apparatus comprising:

an optical pump means for producing a first optical beam along a first defined axis, said first optical beam having a first preselected spectrum having at least one spectral peak;

a resonator cavity means coupled to receive said first optical beam from said optical pump means, for supporting buildup of selected optical power in a first spectral range including said first preselected spectrum and in a second spectral range, said resonator cavity means being disposed to have an axis coincident with said first optical beam for admitting a portion of said first optical beam; and first means for adjusting at least one longitudinal mode in said first spectral range of said resonator cavity means relative to at least one spectral peak of said optical pump means in response to a first control input in order to achieve buildup of optical power at said at least one longitudinal mode;

a coherent optical source for producing a second optical beam along a second defined axis, said second optical beam having a second preselected spectrum having at least one spectral peak within said second spectral range; and second means for adjusting a second longitudinal mode in said second spectral range of said resonator cavity means relative to at least one spectral peak of said coherent optical source in response to a second control input in order to achieve buildup of optical power at said second longitudinal mode, wherein said optical path length adjusting means is a means for adjusting temperature of media through which passes at least said second optical beam at selected positions within said resonator cavity means.

53. The apparatus according to claim 52 wherein said temperature adjusting means is an oven and wherein said media is air.

54. The apparatus according to claim 52 wherein said resonator cavity means is a unidirectional propagation cavity defined by at least one concave reflecting surface and at least two other reflecting surfaces, none of said concave reflecting surfaces and said other reflecting surfaces being disposed to reflect an incident beam along a normal.

55. The apparatus according to claim 52 wherein said first means for adjusting includes optical feedback means wherein said first control input is a portion of the power built up in said resonator cavity means at the wavelength of said at least one longitudinal mode, which is coupled back into the output of said optical pump means with an adjustable phase and an adjustable amplitude to injection lock said at least one spectral peak to a wavelength within the bandwidth of said at least one longitudinal mode.

56. The apparatus according to claim 55 wherein a portion of a third control input controls at least said adjustable phase to maintain the frequency of said at least one spectral peak within a feedback error difference of the central frequency of said at least one longitudinal mode.

57. The apparatus according to claim 56 wherein a portion of a fourth control input also controls the relative free-running wavelength of said optical pump means, which is the wavelength of said at least one spectral peak in the absence of said optical feedback means, relative to the wavelength of said at least one longitudinal mode so that perturbations of both said adjustable phase and said relative free-running wavelength are compensated substantially independently.

58. An apparatus for generating an optical output beam, the apparatus comprising:

an optical pump means for producing a first optical beam along a first defined axis, said first optical beam having a first preselected spectrum having at least one spectral peak;

a resonator cavity means coupled to receive said first optical beam from said optical pump means, for supporting buildup of selected optical power in a first spectral range including said first preselected spectrum, said resonator cavity means being disposed to have an axis coincident with said first optical beam for admitting a portion of said first optical beam;

optical feedback means for achieving buildup of optical power at said at least one longitudinal mode, wherein a fraction of power built up in said resonator cavity means at the wavelength of said at least one longitudinal mode is coupled back into the output of said optical pump means with an adjustable phase and an adjustable amplitude to injection lock said at least one spectral peak to said at least one longitudinal mode;

a first electrical control input for controlling said adjustable phase to maintain frequency of said at least one spectral peak within a feedback error difference of a central frequency of said at least one longitudinal mode; and a second electrical control input for controlling free-running wavelength of said optical pump means relative to said at least one longitudinal mode of said resonator cavity means.

59. The apparatus according to claim 58 wherein said resonator cavity means is a unidirectional propagation cavity defined by at least one concave reflecting surface and at least two other reflecting surfaces, none of said concave reflecting surfaces and said other reflecting surfaces being disposed to reflect an incident beam along a normal.

60. The apparatus according to claim 58 wherein said resonator cavity means is monolithic.

61. An apparatus for generating an optical output beam, the apparatus comprising:

an optical pump means for producing a first optical beam along a first defined axis, said first optical beam having a first preselected spectrum having at least one spectral peak;

a bidirectional propagation cavity means coupled to receive said first optical beam from said optical pump means for supporting buildup of selected optical power in a first spectral range and in a second spectral range, said bidirectional propagation cavity means being disposed to have an axis coincident with said first optical beam for admitting a portion of said first optical beam;

first means for adjusting at least one longitudinal mode in said first spectral range of said bidirectional propagation cavity means relative to at least one spectral peak of said optical pump means in response to a first control input in order to achieve buildup of optical power at said at least one longitudinal mode;

a nonlinear optical element means disposed in said bidirectional propagation cavity means, which is adjustable to phase match at least two optical beams through said nonlinear optical element means, which is phase matched for generating a second optical beam at a preselected frequency along a second defined axis at least partially overlapping said first defined axis; and second means for adjusting a second longitudinal mode in said second spectral range of said bidirectional propagation cavity means relative to said preselected frequency of said second optical beam in response to a second control input in order to achieve buildup of optical power at said preselected frequency for producing an optical output.

62. The apparatus according to claim 61 wherein said bidirectional propagation cavity means is a plano-concave cavity.

63. The apparatus according to claim 61 wherein said bidirectional propagation cavity means is a concave-concave cavity.

64. The apparatus according to claim 61 wherein said bidirectional propagation cavity means is monolithic.

65. An apparatus for generating an optical output beam, the apparatus comprising:

an optical pump means for producing a first optical beam along a first defined axis, said first optical beam having a first preselected spectrum having at least one spectral peak;

a ring resonator cavity means coupled to receive said first optical beam from said optical pump means for supporting buildup of selected optical power in a first spectral range and in a second spectral range, said ring resonator cavity means being disposed to have an axis coincident with said first optical beam for admitting a portion of said first optical beam;

first means for adjusting at least one longitudinal mode in said first spectral range of said ring resonator cavity means relative to at least one spectral peak of said optical pump means in response to a first control input in order to achieve buildup of optical power at said at least one longitudinal mode;

a nonlinear optical element means disposed in said ring resonator cavity means, which is adjustable to phase match at least two optical beams through said nonlinear optical element means, which is phase matched for generating a second optical beam at a preselected frequency along a second defined axis at least partially overlapping said first defined axis; and second means for adjusting a second longitudinal mode in said second spectral range of said ring resonator cavity means relative to said preselected frequency of said second optical beam in response to a second control input in order to achieve buildup of optical power at said preselected frequency for producing an optical output.

66. The apparatus according to claim 65 wherein said unidirectional propagation cavity is a three-reflection ring having a first planar reflecting surface and a second planar reflecting surface.

67. The apparatus according to claim 65 wherein said unidirectional propagation cavity is a bow-tie cavity having four reflecting surfaces in folded-path configuration.

68. The apparatus according to claim 65 wherein said first means for adjusting includes optical feedback means wherein said first control input is a portion of the power built up in said ring resonator cavity means at the wavelength of said at least one longitudinal mode, which is coupled back into the output of said optical pump means with an adjustable phase and an adjustable amplitude to injection lock said at least one spectral peak to a wavelength within the bandwidth of said at least one longitudinal mode.

69. The apparatus according to claim 68 wherein a portion of a third control input controls at least said adjustable phase to maintain the frequency of said at least one spectral peak within a feedback error difference of the central frequency of said at least one longitudinal mode.

70. The apparatus according to claim 69 wherein a portion of a fourth control input also controls the relative free-running wavelength of said optical pump means, which is the wavelength of said at least one spectral peak in the absence of said optical feedback means, relative to the wavelength of said at least one longitudinal mode so that perturbations of both said adjustable phase and said relative free-running wavelength are compensated substantially independently.

71. The apparatus according to claim 65 wherein said second adjusting means includes an adjustable optical path length means in said ring resonator cavity means which adjusts the optical path length of said second optical beam relative to the optical path length of said first optical beam, such that buildup at said preselected frequency is supported by said ring resonator cavity means at the same time as buildup at said at least one longitudinal mode.

72. The apparatus according to claim 71 wherein said adjustable optical path length means is said nonlinear optical element means including means for rotation of said nonlinear optical element means about the polarization vector of said first optical beam.

73. The apparatus according to claim 71 wherein said adjustable optical path length means is a means for adjusting temperature of media at selected positions within said ring resonator cavity means through which pass at least said second optical beam.

74. The apparatus according to claim 73 wherein said temperature adjusting means is an oven and wherein said media is air.

* * * * *